(12) United States Patent
Going et al.

(10) Patent No.: US 6,271,579 B1
(45) Date of Patent: Aug. 7, 2001

(54) HIGH-FREQUENCY PASSBAND MICROELECTRONICS PACKAGE

(75) Inventors: Timothy J. Going, Olivenhain; Alan W. Lindner, San Diego, both of CA (US)

(73) Assignee: Stratedge Corporation, San Diego, CA (US)

( * ) Notice: Subject to any disclaimer, the term of this patent is extended or adjusted under 35 U.S.C. 154(b) by 0 days.

(21) Appl. No.: 09/685,632

(22) Filed: Oct. 9, 2000

Related U.S. Application Data

(63) Continuation-in-part of application No. 09/220,133, filed on Dec. 23, 1998, which is a continuation of application No. 09/054,049, filed on Apr. 2, 1998, now abandoned, which is a continuation of application No. 08/645,848, filed on May 14, 1996, now Pat. No. 5,736,783, which is a continuation-in-part of application No. 08/526,535, filed on Sep. 11, 1995, now Pat. No. 5,692,298, which is a continuation of application No. 08/231,492, filed on Apr. 22, 1994, now Pat. No. 5,448,826, which is a division of application No. 08/134,269, filed on Oct. 8, 1993, now Pat. No. 5,465,008.

(51) Int. Cl.$^7$ ................................................ H01L 29/40
(52) U.S. Cl. .......................................... 257/664; 257/691
(58) Field of Search ..................................... 257/664, 691, 257/710, 700, 728, 649, 703, 692; 333/246, 247; 438/125, 113

(56) References Cited

U.S. PATENT DOCUMENTS

| | | |
|---|---|---|
| 4,875,087 | * 10/1989 | Miyauchi et al. . |
| 5,477,085 | * 12/1995 | Kose . |
| 5,691,673 | * 11/1997 | Ishikawa et al. . |
| 5,692,298 | * 12/1997 | Goetz et al. . |
| 5,736,783 | * 4/1998 | Wein et al. . |
| 5,852,391 | * 12/1998 | Watanabe . |
| 6,172,412 | * 1/2001 | Wein et al. . |

FOREIGN PATENT DOCUMENTS 58-92244 * 6/1983 (JP) .

* cited by examiner

*Primary Examiner*—Sheila V. Clark
(74) *Attorney, Agent, or Firm*—Brown, Martin, Haller & McClain

(57) ABSTRACT

A high-frequency passband microelectronic package suitable for housing a high-frequency (e.g.,GHz range) electronic device operating at frequencies within the passband is disclosed herein. The package includes a base, an RF circuit substrate attached to a surface of the base and having a cavity for receiving the electronic device, and transmission lines formed on a surface of the circuit substrate. Each transmission line includes a first conductive pad for attachment to a node of the electronic device, a second conductive pad for attachment by a conductive lead to a node external to the package, and a matching circuit electrically coupled between the pads. The matching circuit includes a non-straight conductive trace shaped to compensate for impedance discontinuities between the node of the electronic device and the node external to the package at the high-frequency passband. For example, the trace can be shaped to compensate for the impedance discontinuity caused by the lead. The shape of the trace is determined by an electromagnetic simulation computer program simulating the frequency response of the transmission line based upon predetermined parameters defining the electromagnetic environment in which the trace will be used, and iterating the shape of the trace until desired performance characteristics are met at a passband frequency range of interest. The transmission lines may include microstrip, co-planar waveguide, and stripline transmission lines. A mating transmission line having such a matching circuit can also be formed on a circuit board having such a high-frequency package mounted thereto.

30 Claims, 6 Drawing Sheets

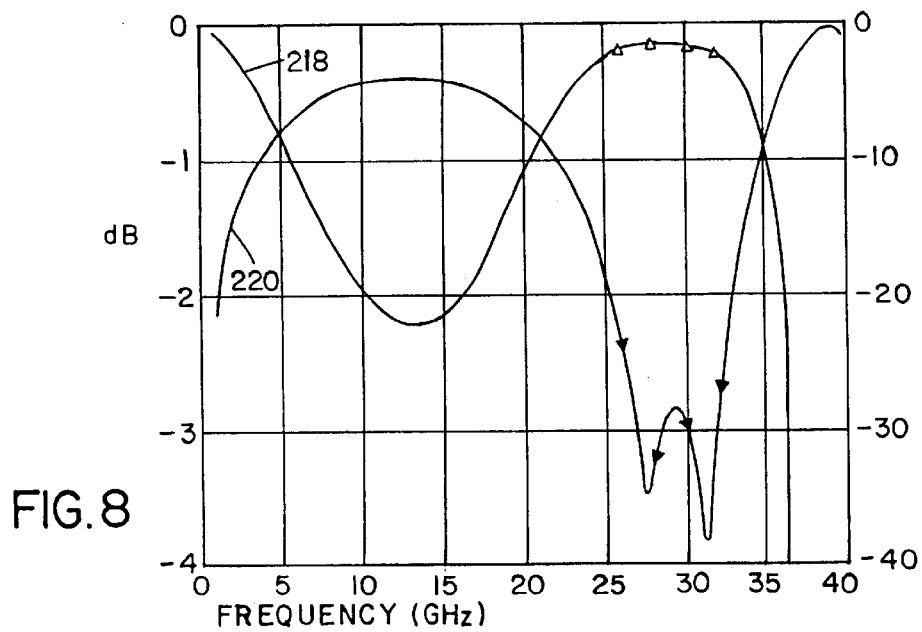
FIG. 8
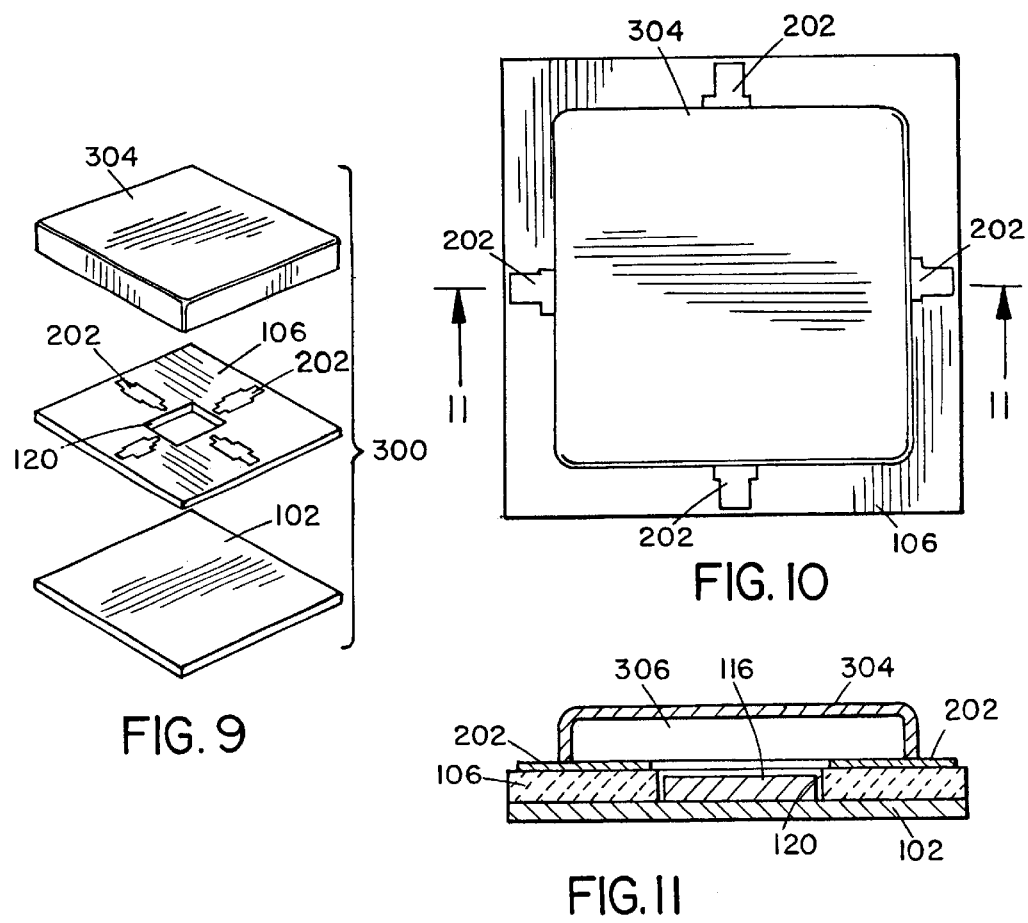
FIG. 9
FIG. 10
FIG. 11

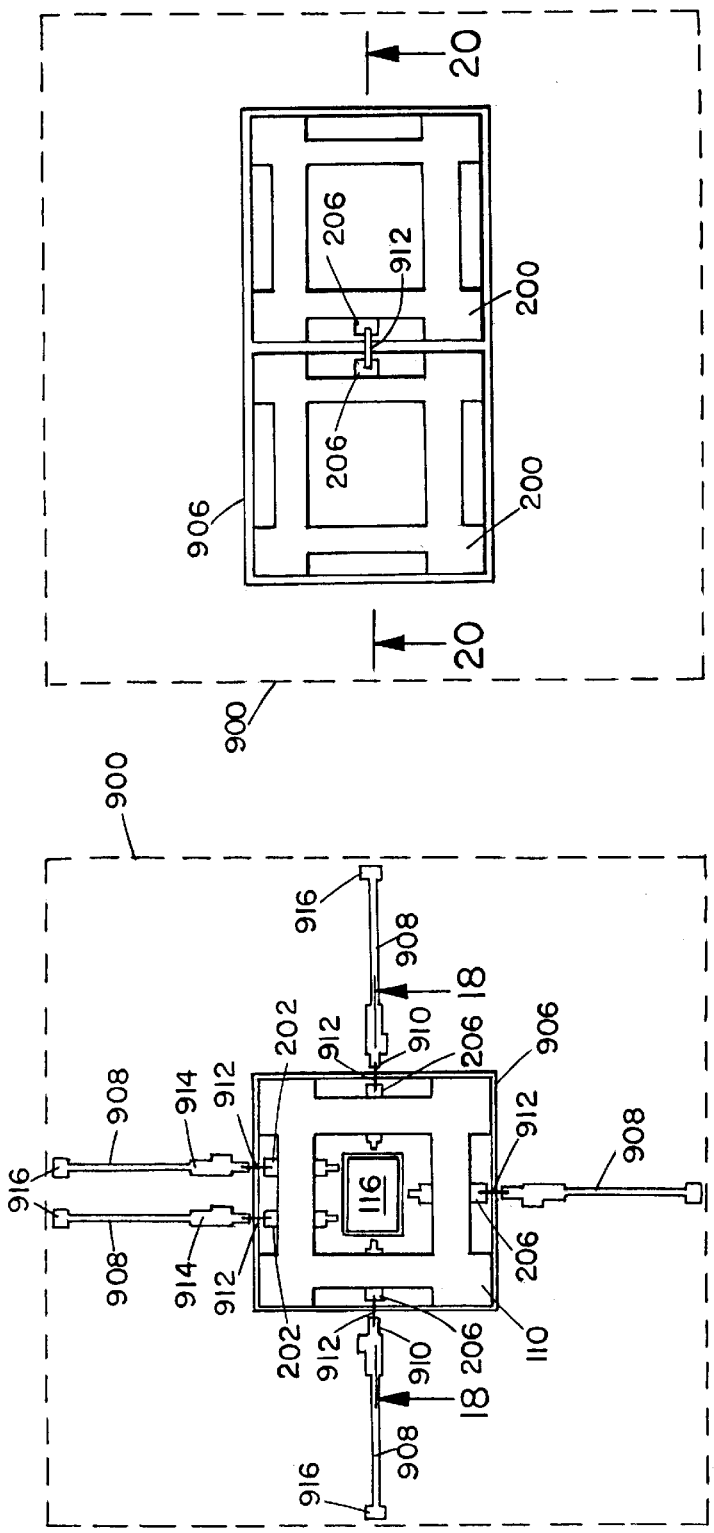

HIGH-FREQUENCY PASSBAND MICROELECTRONICS PACKAGE

This application is a continuation-in-part of application Ser. No. 09/220,133 filed Dec. 23, 1998, which is a continuation of application Ser. No. 09/054,049 filed Apr. 2, 1998 now abandoned, which is a continuation of application Ser. No. 08/645,848 filed May 14, 1996, now issued as U.S. Pat. No. 5,736,783, which is a continuation-in-part of application Ser. No. 08/526,535 filed Sep. 11, 1995, now issued as U.S. Pat. No. 5,692,298, which is a continuation of Ser. No. 08/231,492 filed Apr. 22, 1994, now issued as U.S. Pat. No. 5,692,298, which is a divisional of application Ser. No. 08/134,269 filed Oct. 8, 1993, now issued as U.S. Pat. No. 5,465,008.

FIELD OF THE INVENTION

The present invention generally relates to the field of microelectronic packages for high-frequency electronic devices, and specifically relates to a high-frequency passband microelectronic package for use as a leaded electronic interconnect housing for a high-frequency electronic device operating at frequencies within the passband.

BACKGROUND OF THE INVENTION

A key requirement for the packaging of a microelectronic device is that signals move through the package's conductive interconnects such that the electrical interconnection causes minimal change in the signals. It is difficult, however, to fabricate microelectronic packages to achieve minimal signal change at higher frequencies, i.e., frequencies in the Gigahertz (GHz) range. Along with limited frequency ranges, conventional microelectronic packages have excessive transmission and reflective losses, limited input/output isolation, high cost, and limited reliability, resulting in a lack of general applicability.

It is even more difficult to fabricate high frequency microelectronic packages which can be connected via conductive leads to a next level of assembly such as a circuit board or other microelectronics package. Conventional leaded microelectronic packages, including those having stripline transmission lines, experience unacceptable insertion and return signal losses which change the signals at high frequencies. The unacceptable electrical properties are due to impedance discontinuities caused by the leads, and interconnections between the leads and mating lead pads on the package and on the next level of assembly.

The above-listed related applications and patents disclose improved microelectronic packages that address one or more of the problems due to limitations and disadvantages of the related art. For example, U.S. Pat. No. 5,448,826 shows a ceramic microelectronics package 100 suitable for housing high-frequency electronic devices, as shown in FIGS. 1–3 herein. Package 100 includes a base 102, first attaching means 104, a ceramic radio-frequency (RF) circuit substrate 106, second attaching means 108, a ceramic seal ring substrate 110, non-conducting third attaching means 112, and a ceramic lid 114. Package 100 is used as an electronic interconnect housing for a high-frequency electronic device or component 116 mounted to base 102. Device 116 is received within a cavity 120 formed within circuit substrate 106. A plurality of conductive traces 122 patterned on circuit substrate 106 provide electrical connections between device 116 and an external device (not shown). Seal ring substrate 110 has a cavity 124 larger than cavity 120. Device 116 is an exemplary high-frequency electronic device housed within package 100, and it is understood that device 116 represents any high-frequency electronic device or component. Package 100, and the process for making package 100, are fully disclosed in the '826 patent, which is incorporated herein by reference.

Each conductive trace 122 in package 100 forms a portion of a microstrip transmission line. "Microstrip transmission line" is defined herein as being a conductor suspended above a ground plane and separated from the ground plane by a dielectric. Each conductive trace 122 is a conductor, base 102 forms a ground plane, ceramic circuit substrate 106 is a dielectric, and each trace 122 is suspended above base 102 and is separated from base 102 by substrate 106. Thus, each conductive trace 122 forms a portion of a microstrip transmission line which propagates a signal between the external device and device 116 as electric and magnetic fields. The impedance of microstrip transmission lines is a function of the dielectric value of substrate 106, the width of traces 122, the gap to the top surface of the ground plane formed by base 102, and the thickness of substrate 106 below traces 122. Mathematical formula are known which approximate the impedance for given dielectric and conductor parameters and geometries.

Each microstrip transmission line in package 100 has the form of a microstrip, embedded microstrip, microstrip transmission line as the line transitions from outside package 100, beneath seal ring substrate 110, to inside package 100. An "embedded microstrip transmission line" is a microstrip transmission line located beneath a second dielectric material, i.e., sandwiched between two dielectric layers or materials. Since ceramic circuit substrate 106 and seal ring substrate 110 are both formed from dielectric material, the middle portion of each microstrip transmission line passing beneath seal ring substrate 110 has the form of an embedded microstrip transmission line, and the portions of each microstrip transmission line on either side of substrate 110 (i.e., not beneath substrate 110) have the form of regular (i.e., non-embedded) microstrip transmission lines.

The microstrip transmission lines in package 100, including conductive traces 122, transition through microstrip feed-throughs when entering and exiting the package. A "feed-through" is an area within a dielectric through which a portion of a conductive trace which passes, such as from the interior of a package to the exterior of a package. For example, the presence of seal ring substrate 110 causes the microstrip transmission lines to pass through such an area as the transmission lines transition from outside package 100 to inside package 100. Thus, the feed-throughs of package 100 can be referred to as microstrip feed-throughs.

Package 100 can be referred to as a high-frequency broadband microelectronics package. "Broadband" refers to the ability of broadband signals (DC to GHz frequencies) to move through the package's conductive interconnects such that the electrical connections cause minimal change in the signals. Each trace 122 includes an outer conductive bonding pad for electrical connection to the next level of assembly (e.g., a circuit board or another package) by wire or ribbon bonding the outer bonding pad to a corresponding or mating pad on the next level of assembly. For example, the mating pads may be joined by a thin gold wire tack-welded to each pad and passing over a gap between the pads. The only deviations from a continuous transmission line (which would give an optimal frequency response) is the error in matching the width of the bond wire to the width of the transmission line conductor, the weld joints, the gap in the dielectric, and a small gap in the ground plane. The use of wire or ribbon bonds to perform these interconnections provides the transmission lines with an impedance compatible with high frequencies.

Package 100, however, is not designed to be connected to the next level of assembly using conductive leads in such high-frequency applications. A "lead" is typically a generally rectangular piece of metal conductor which can be electrically connected by braising or soldering the lead between a lead pad formed on a microelectronics package and a mating lead pad formed on a next-level circuit board or another package. A "lead pad" is an anchor pad formed in the transmission line for receiving the lead. For example, on a package including a 10 mil (i.e., 0.010") thick, 96% alumina ceramic circuit substrate, the calculated width of the conductor for a microstrip transmission line would be 10 mil. The ideal lead would also be 10 mil wide, and would be attached to the conductor without creating a lump.

In practice, however, the end of the conductor where the transmission line approaches the edge of the package is widened to form a lead or anchor pad 25 mil wide to provide a strong mechanical bond between the lead and the lead pad. The lead pad is made wider than the lead to allow for some mis-alignment during assembly and for an attachment fillet. The lead also has a finite thickness creating a change in thickness of the transmission line. The braise or solder used to connect the lead between the lead pads forms lumps. The change in width of the transmission line at the anchor pad, the thickness change of the lead, and the braise or solder lumps have combined to limit the upper frequency of leaded microelectronics packages to lower Gigahertz frequencies. For frequencies in the mid Gigahertz range and above, the lead and interconnections between the lead and the lead pads, create impedance discontinuities having unacceptable electrical properties which cause the signals to experience more than minimal changes. Thus, microelectronics packages, such as package 100 operating in the higher frequencies, e.g., above 20–23 GHz, have used wire or ribbon bonding to interconnect the package conductors with mating conductors on the next level of assembly.

The use of wire bonding, however, to electrically interconnect the outer pads of traces 122 to the mating pads on the next level of assembly has certain disadvantages in comparison to connections made using conductive leads. First, wire bonding is a relatively labor intensive operation when performed manually, and requires relatively expensive automatic wire bonding equipment when performed automatically. Second, wire bonding requires relatively expensive materials. Third, wire bonding requires relatively tight dimensional tolerances between the corresponding pads which impose restraints on the manufacturing processes. These disadvantages combine to increase the costs associated with using package 100 in high-frequency applications. The increased costs are especially disadvantageous in high-volume, low-cost applications, such as in high-volume, low-cost consumer electronics applications.

Thus, it would be desirable to provide a high-frequency microelectronics package suitable for housing a high-frequency electronic device operating at high frequencies, e.g., in and above the Gigahertz range, which can be connected to the next level of assembly using conductive leads. Such a package would reduce labor and material requirements, eliminate the need for automatic wire bonding equipment, and loosen the dimensional tolerances required of the assembly process compared to packages designed to be wire or ribbon bonded to the next level of assembly.

BRIEF SUMMARY OF THE INVENTION

It is an advantage of the present invention to provide an improved microelectronics package suitable for housing a high-frequency electronic device which realizes the above-listed advantages. It is also an advantage to provide a high-frequency passband microelectronics package suitable for use as a leaded electronic interconnect housing for a high-frequency electronic device operating at frequencies within the passband which can be interconnected to the next level of assembly using conductive leads rather than wire or ribbon bonds.

A first exemplary embodiment of the present invention relates to a transmission line for use with a high-frequency passband microelectronics package. The package is suitable for housing a high-frequency electronic device operating at frequencies within the passband which has at least one electrical node to be electrically coupled by the transmission line and a conductive lead to a corresponding electrical node external to the package. The transmission line includes a first conductive pad for electrical attachment to the node of the electronic device, a second conductive pad for electrical attachment by the conductive lead to the node external to the package, and a matching circuit electrically coupled between the pads. The matching circuit includes a non-straight conductive trace shaped to compensate for at least one impedance discontinuity between the node of the electronic device and the node external to the package at the high-frequency passband of the package.

A second exemplary embodiment of the present invention relates to a high-frequency passband microelectronics package suitable for housing a high-frequency electronic device operating at frequencies within the passband. The electronic device has at least one electrical node to be electrically coupled by a conductive lead to a corresponding electrical node external to the package. The package includes a base, an RF circuit substrate attached to a top surface of the base, the RF circuit substrate having a cavity for receiving the electronic device, and at least one transmission line formed on a surface of the RF circuit substrate. The transmission line includes a first conductive pad for electrical attachment to the node of the electronic device, a second conductive pad for electrical attachment by the conductive lead to the node external to the package, and a matching circuit electrically coupled between the pads. The matching circuit includes a non-straight conductive trace shaped to compensate for at least one impedance discontinuity between the node of the electronic device and the node external to the package at the high-frequency passband of the package.

Another exemplary embodiment of the present invention relates to a circuit board for mounting at least one high-frequency microelectronics package which operates at frequencies within a passband. The package has at least one electrical node to be electrically coupled by a conductive lead to a corresponding electrical node external to the package. The circuit board includes a lower circuit board layer, a circuit board substrate layer attached to a top surface of the lower circuit board layer and having a cavity for receiving the microelectronics package, and at least one transmission line formed on a surface of the circuit board substrate layer. A circuit board cavity may not be required if the microelectronics package includes gull wings. The transmission line includes a first conductive pad for electrical attachment by the conductive lead to the node of the high-frequency package, a second conductive pad for electrical attachment to the node external to the package, and a matching circuit electrically coupled between the pads. The matching circuit includes a non-straight conductive trace shaped to compensate for at least one impedance discontinuity between the node of the package and the node external to the package at the high-frequency passband of the package.

Another embodiment of the present invention relates to a process for assembling a high-frequency passband microelectronic package for retaining a high-frequency integrated circuit operating at frequencies within the passband. The package has a base and an RF circuit substrate. The integrated circuit has at least one electrical node to be electrically coupled by a conductive lead to a corresponding electrical node external to the package. The process includes depositing at least one transmission line on a top surface of the RF circuit substrate. The transmission line includes a first conductive pad for electrical attachment to the node of the integrated circuit, a second conductive pad for electrical attachment by the conductive lead to the node external to the package, and a matching circuit electrically coupled between the pads. The matching circuit includes a non-straight conductive trace shaped to compensate for at least one impedance discontinuity between the node of the integrated circuit and the node external to the package at the high-frequency passband of the package. The process also includes cutting a cavity into the circuit substrate dimensioned to receive the integrated circuit, attaching a top surface of the base to a bottom surface of the RF circuit substrate to form an assembly, and firing the assembly.

BRIEF DESCRIPTION OF THE DRAWINGS

Understanding of the present invention will be facilitated by consideration of the following detailed description of a preferred embodiment of the present invention, taken in conjunction with the accompanying drawings, in which like reference numerals refer to like parts and in which:

FIG. 8 is a plot of the predicted electrical insertion loss and return loss of the transmission line shown in FIG. 7 when used with a high-frequency passband microelectronics package such as that shown in FIG. 4;

FIG. 9 is an exploded view of a microelectronics package with microstrip transmission lines including shaped matching circuits for use as a leaded electronic interconnect housing for a high-frequency electronic device, the microelectronics package including a sealing cap;

FIG. 10 is a top view of the microelectronics package shown in FIG. 9 with the sealing cap installed;

FIG. 11 is a cross-sectional view of the microelectronics package of FIG. 9 with the sealing cap installed taken along line 11—11 in FIG. 10;

FIG. 17 is a top view of the microelectronics package shown in FIG. 5 with the lid removed and mounted on a circuit board, the transmission lines of the package being connected by leads to mating transmission lines also including shaped matching circuits formed on the circuit board;

FIG. 18 is a cross-sectional view of the leaded microelectronics package mounted on the circuit board taken along line 18—18 in FIG. 17;

FIG. 19 is a top view of two microelectronics packages as in FIG. 5 with the lids removed and mounted on a circuit board, the packages having mating transmission lines connected to each other by a lead; and FIG. 20 is a cross-sectional view of the two leaded microelectronics packages mounted on the circuit board taken along line 20—20 in FIG. 19.

DETAILED DESCRIPTION OF A PREFERRED EMBODIMENT

Figure 4:
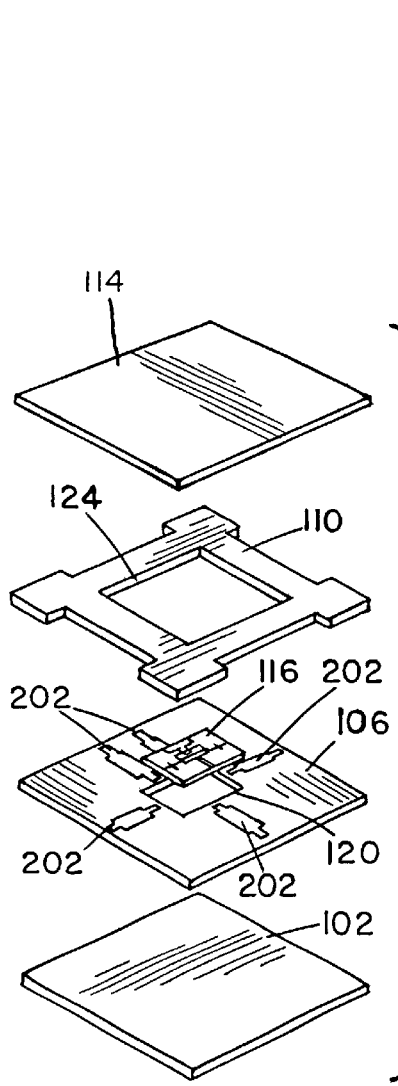
FIG. 4 is an exploded view of a microelectronics package with microstrip transmission lines including shaped matching circuits for use as a leaded electronic interconnect housing for a high-frequency electronic device in accordance with a first embodiment of the present invention.
Figure 5:
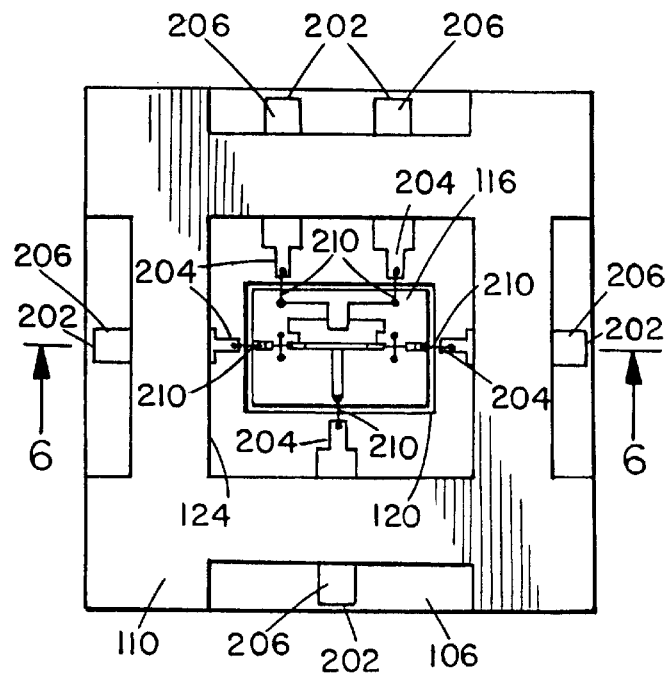
FIG. 5 is a top view of the microelectronics package shown in FIG. 4 with the lid removed.
Figure 6:
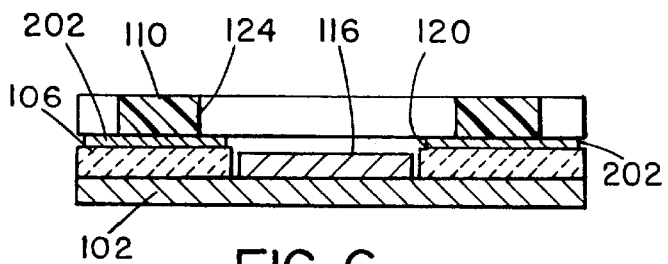
FIG. 6 is a cross-sectional view of the microelectronics package shown in FIG. 4 with the lid removed taken along line 6—6 in FIG. 5.

Referring to FIGS. 4–6, a ceramic microelectronics package 200 in accordance with a first embodiment of the present invention includes a base 102, a ceramic radio-frequency (RF) circuit substrate 106, a ceramic seal ring substrate 110, and a lid 114. Package 200 is used as a leaded electronic interconnect housing for a high-frequency electronic device or component 116 mounted to base 102. Device 116 is received within a cavity 120 formed within circuit substrate 106. Seal ring substrate 110 has a cavity 124 larger than cavity 120. Device 116 is an exemplary high-frequency electronic device housed within package 200, and it is understood that device 116 represents any high-frequency electronic device or component (e.g., a GaAs semiconductor die). A plurality of conductive traces 202 are formed on the top surface of circuit substrate 106 to provide electrical connections between electrical nodes of device 116 and electrical nodes external to package 200 (i.e., conductive lead pads on the next level of assembly).

Figure 1:
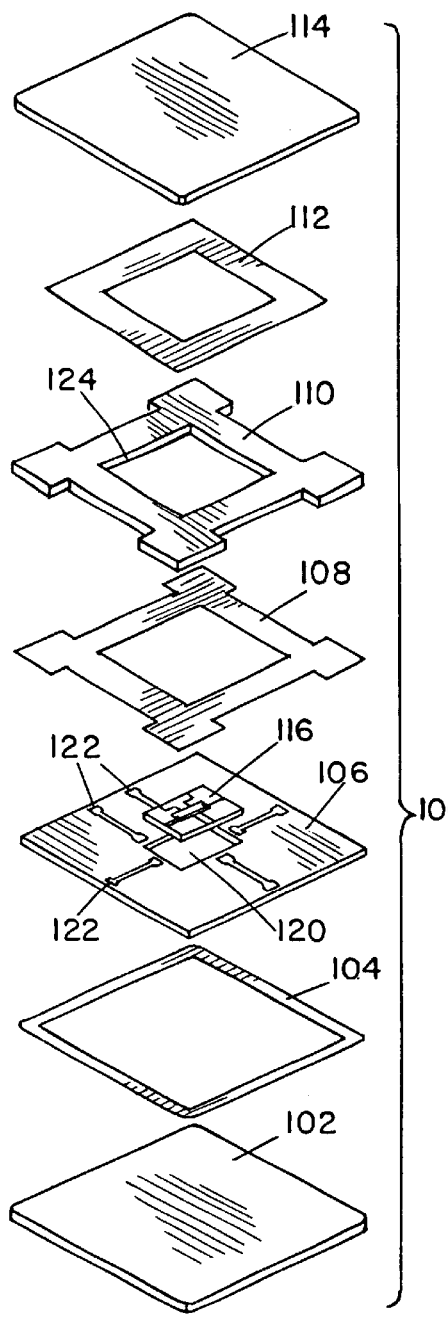
FIG. 1 is an exploded view of a microelectronics package with microstrip transmission lines for use as an electronic interconnect housing for a high-frequency electronic device, the package of FIG. 1 being part of the background of the present invention.
Figure 2:
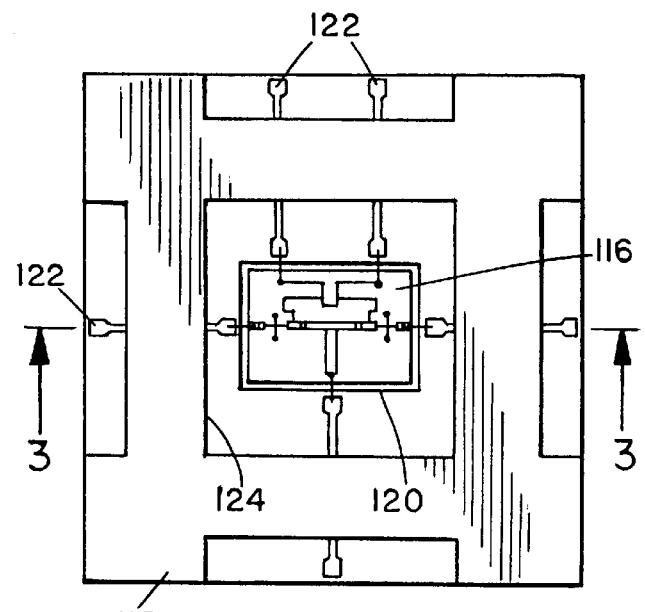
FIG. 2 is a top view of the microelectronics package shown in FIG. 1 with the lid removed.
Figure 3:
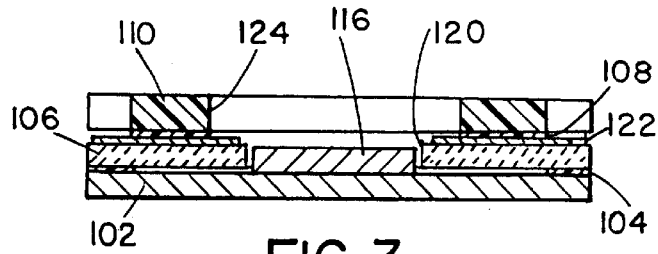
FIG. 3 is a cross-sectional view of the microelectronics package shown in FIG. 1 with the lid removed taken along line 3—3 in FIG. 2.

A comparison between package 100 (FIGS. 1–3) and package 200 (FIGS. 4–6) reveals that conductive traces 122 formed on the top surface of circuit substrate 106 in package 100 are replaced by shaped conductive traces 202 formed on the top surface of circuit substrate 106 in package 200. Traces 202 are conductive patterns providing electrical connections between electrical nodes of device 116 and electrical nodes of an external device or circuit board. FIGS. 4–6 show traces 202 extending from the sides of device 116 for electrically connecting device 116 to external nodes. However, it will be appreciated that more or fewer traces 202 may be used, and that they may be connected to device 116 at other locations.

Each trace 202 includes a wirebond pad 204 at the inner perimeter of circuit substrate 106 surrounding cavity 120, a lead pad 206 at the outer perimeter of circuit substrate 106, and a matching circuit 208 extending therebetween. Each wirebond pad 204 is electrically connected to an electrical node of device 116 by a bond wire 210 having a first end tack-welded to pad 204 and a second end tack-welded to a node of device 116. Bond wire 210 can include, for example, a gold wire melted into gold material of pad 204 and gold material at the node of device 116 to form a solid gold connection. Although only one bond wire 210 is shown making each bond, multiple bond wires 210 are typically bonded between each wirebond pad 204 and the equivalent node on device 116, as may be called out in the vendor's application notes for the device. Alternatively, ribbon bonding can be used. Each lead pad 206 is sized for making a solid mechanical connection to a conductive lead 912 (FIGS. 17–20) used to electrically attach the respective node of device 116 to a corresponding node of an external package, device or circuit board.

Referring back to FIGS. 1–3, the middle portion of each trace 122 is formed by a straight conductive trace having a constant width. Wirebond pads on either end of trace 122 give the trace its "dog-bone" shape. Trace 122 may also be completely straight if the wirebond pads are not wider than the transmission line signal conductor. In contrast, each matching circuit 208 in FIGS. 4–6 is formed by a non-straight conductive trace having a specific shape which compensates for impedance discontinuities in the transmission line. The shape of traces 202 is discussed in detail below.

Base 102 has multiple uses, including providing a mechanical mount for package 200 onto a circuit board or carrier (not shown), a thermal and electrical mount for high-frequency electronic device 116 to be housed in the package, and as an electrical ground reference (i.e., "ground plane"), for the high-frequency conductors and other signal traces used as the interconnect. As embodied herein, base 102 can be formed entirely of conductive metal, such as Kovar®, Invar®, copper, copper-tungsten, copper-molybdenum, or molybdenum. Each metal offers advantages in electrical and thermal conductivity, structural strength, low coefficient of thermal expansion, and compatibility to electroplated conductors (for example, nickel, silver, silver-platinum, silver-palladium, or gold). These metals are only exemplary, and one skilled in the art will recognize that other metals can be used.

Alternatively, base 102 can also be formed from a ceramic material with metallization applied to certain areas, such as the die attach area for device mounting, for the ground connection, and/or the bottom of base 102 for attaching package 200 to a circuit board or carrier. Examples of appropriate ceramic material are aluminum oxide, aluminum nitride, beryllium oxide, fosterite, cordierite, quartz, fused silica, or other ceramics having a composition making them usable as a packaging material. Other ceramic materials not enumerated herein, but providing acceptable electrical and physical properties, are also known in the art.

The base 102 is bonded or otherwise attached to the ceramic radio-frequency (RF) circuit substrate 106 using a suitable bonding material. For a metal base or ceramic base with metallization, a metallic solder made from some composition providing good adhesion between metals can be applied either to the top surface of base 102 or the bottom surface of circuit substrate 106. An example of such a composition would be gold-germanium or gold-tin composite, although other suitable compositions will be apparent to those skilled in the art.

For either a ceramic base or a metal base, a glass material, such as seal glass or an epoxy, can be applied between base 102 and circuit substrate 106 in order to adhere the base to the circuit substrate. Where co-fired technology is used, all or part of the bonding material will be incorporated into the green tape of which the circuit substrate 106 is formed. Those skilled in the art will recognize that other bonding materials and bonding processes not enumerated herein, but providing acceptable electrical and physical properties, can also be used.

Circuit substrate 106 is made of a ceramic material, such as one of the ceramic materials enumerated above with respect to base 102. Circuit substrate 106 has cavity area 120 cut out of it such that, when attached to base 102, the circuit substrate and base together provide a planar interconnect for device 116 or devices mounted on the base. Moreover, circuit substrate 106 has shaped conductive traces 202 deposited on its surface to form conductive signal patterns as stated above. The design of the specific shapes used for traces 202 is accomplished through the use of electrical modeling and simulation software tools, as well as through experimentation, as described in detail below.

The ceramic radio-frequency (RF) circuit substrate 106 is attached or bonded to the ceramic seal ring substrate 110 using a suitable bonding material and/or process. In an exemplary embodiment, a glass material (e.g., seal glass) or appropriate epoxy adhesive is deposited on either or both circuit substrate 106 and seal ring substrate 110. If seal glass or epoxy is to be deposited on circuit substrate 106, it will preferably be formed such that the dimensions of the glass deposited on the circuit substrate will substantially match those of the seal ring substrate. Other embodiments may utilize other bonding materials that, ideally, have a coefficient of thermal expansion (CTE) and dielectric constant that match as close as possible the CTE and dielectric constant of the material selected for the circuit substrate 106 and the ceramic seal ring substrate 110. As will be apparent to those in the art, separate bonding material may be eliminated if co-fired technology, e.g., low-temperature co-fired ceramic (LTCC) or high temperature co-fired ceramic (HTCC) is being used, in which case the attaching means will be the glass-ceramic materials incorporated into the pre-fired ceramic substrates which, upon firing, fuse the two substrates together.

Seal ring substrate 110 is made of the same or similar material as that used for circuit substrate 106. As described above, if seal glass is used as the bonding material it is applied to the bottom surface of the seal ring substrate 110, which, when fused to circuit substrate 106 or to glass deposited on circuit substrate 106, creates a hermetic seal between the two substrates. Similarly, for co-fired technology, the glass-ceramic materials in the substrate should fuse the two substrates to provide a hermetic seal. To attain the proper hermeticity and lamination of seal ring substrate 110 and circuit substrate 106, the two substrates can be weighted together during the fusing process.

Cavity 124 in seal ring substrate 110 is formed such that it is larger than cavity 120 formed in circuit substrate 106. This can be seen in the overhead view provided by FIG. 5, and the cross-sectional view provided in FIG. 6. Seal ring substrate cavity 124 is made larger so that a portion of each conductive signal trace 202, including its wirebond pad 204, is exposed inside cavity 124, as shown in FIG. 5. The outer dimensions of seal ring substrate 110 vary to expose a portion of each signal trace 202, including its lead pad 206, on the outside of package 200, as also shown in FIG. 5.

Referring again to FIG. 4, lid 114 may be made of the same or a similar material as that used for circuit substrate 106 and/or seal ring substrate 110. The lid 114 is attached to the seal ring substrate 110 after insertion of the intergrated circuit(s) using a material such as a non-conductive polymer adhesive (e.g., epoxy). The adhesive can be affixed to the bottom of lid 114 in a window frame fashion to adhere lid 114 to seal ring substrate 110. As is known, non-conductive adhesive materials can be deposited to fill the entire cavity such that it covers the circuit, to provide an inexpensive protective and shock-absorbing seal. Alternatively, the lid 114 can be bonded to seal ring substrate 110 using a low-temperature seal glass. Either the bottom or top surface of lid 114 may be coated with a material that reduces cavity resonances.

Package 200 transmits and receives electrical signals with minimal loss and uses a minimal amount of conductive and non-conductive materials. The package also eliminates the need for a stripline type of transmission line through a ceramic wall, as is used in some related packages. The package construction is not limited to a single material combination, but can use a variety of materials, both conductive and dielectric, to produce a package suitable for high-frequency electronic devices.

The inventive package 200 satisfies the requirements for a microelectronics package suitable for high-frequency electronic devices, using a minimum of conductive materials. First, the package satisfies the structural requirements of resistance to thermal and mechanical shock, moisture, salt atmosphere, vibration, and acceleration, as well as having the characteristic of solderability. The package also satisfies several electrical requirements, including low parasitic effects (i.e., inductance and capacitance), minimal discontinuity reactances, low dissipation loss, and minimal interaction with surrounding devices and environment.

Another aspect of the present invention is a process for assembling a microelectronic package. A preferred process embodiment for use with pre-fired ceramics includes the following steps: Screen printing patterns of conductive paste on the top surface of the circuit substrate; drying and firing the conductive paste; etching to further define the conductive patterns in the paste; screen printing a first seal glass layer on the top surface of the circuit substrate; drying and glazing the first seal glass layer; screen printing a second seal glass layer on the bottom surface of the seal ring substrate; drying and glazing the second seal glass layer; assembling the circuit substrate to the seal ring substrate; and attaching the top surface of the base to the bottom surface of the circuit substrate.

Before beginning the process for use with pre-fired ceramics, fully-fired (i.e., hardened) ceramics are selected for circuit substrate 106, ceramic seal ring substrate 110, and lid 114. Preferably, the same ceramic is selected for each component. As for base 102, if it is made of a ceramic, it could be the same fully-fired ceramic selected for the other components, or it could be a different ceramic material which is compatible with circuit substrate 106 but may have either better electrical or thermal properties. Any of the ceramic substrates may be alumina ($Al_2O_3$) of various purities (e.g., 96%, 99.6%), berrylia (BeO), Barium Titanate ($BaTiO_3$), fused silica ($SiO_2$), or aluminum nitride (AlN), the material being selected to meet the specialized requirements of the product to be assembled. For example, aluminum nitride and berrylia are desirable for high power, heat dissipative applications.

Fully-fired (hardened) ceramics are commercially available from ceramic vendors. A fully-fired ceramic substrate is typically purchased in one inch to 4.5 inch blanks, with the size selected according to the product to be assembled and the quantity of product desired.

Alternatively, co-fired ceramic technology, preferably a low temperature co-fired ceramic (LTCC) process, may be used. For LTCC processing, the ceramic-glass material is provided in the form of green tape. As is known in the art, the substrates to be formed from the green tape are dimensioned to compensate for shrinkage during firing. In addition, because the glass incorporated within the ceramic material provides the adhesive for joining two substrates together, the use of a separate seal glass or epoxy between the circuit and seal ring substrates is unnecessary.

For the pre-fired process, circuit substrate 106, preferably 96% pure alumina, is fabricated as follows. Circuit substrate 106 is cleaned ultrasonically using a detergent suitable for electronic applications and rinsed with deionized water, then fired to burn out any residues from the detergent. Preferably, an Alconox detergent is used, although those skilled in the art will recognize that other detergents can be used.

Next, a conductive paste is screen printed over the top surface of the circuit substrate 106. A first method of defining the conductive patterns or traces is to provide preliminary conductive patterns which have significantly larger dimensions than the desired final dimensions of conductive traces 202. Those skilled in the art will recognize that thin film techniques may also be used to deposit the conductive patterns. The photolithography/etch sequence described below will then be used to define the final dimensions of the conductive patterns. A second possible method is to screen print the conductive paste using a screen that provides the actual final dimensions of traces 202. If the second method is selected, no etch step is required.

After the conductive paste is printed over circuit substrate 106, it is dried. Circuit substrate 106 is then fired according to the specifications provided by the manufacturer of the conductive paste.

With respect to the first method of defining conductive traces 202, the method of forming the preliminary conductive patterns uses thick film screen printing techniques, as are known in the art. Depending on the application and the type of conductor used, it may be desirable to repeat the printing sequence at least once to attain greater thickness and more uniform density of material, with each printing step being followed by drying and firing steps. The firing temperature, time, and conditions depend on the type of conductive material used, the appropriate parameters being provided by the supplier of the conductive paste. Preferably, the printing, drying, and firing steps will be performed twice in the present invention. The second method for defining the conductive traces 202 requires similar processing after the conductive paste is printed onto circuit substrate 106.

A large number of conductive pastes are available, and the selection of such a paste will depend upon the product being fabricated. Many pastes are combinations of gold and glass, with variations in the mixtures providing various levels of hermeticity, wire bondability, solderability, etchability, and adhesion. Other possible pastes include silver or copper. Selection of the appropriate paste for the desired product quality falls within the level of skill in the art. Preferably, however, an etchable gold conductor is used in the present invention, and the preferred embodiment is described accordingly.

When preliminary conductive patterns with dimensions larger than the desired final dimensions are in place on circuit substrate 106, a photolithographic process is used to more precisely define the dimensions of the conductors after which an etch is performed to remove the excess conductive material. This patterning step follows the process as is known in thin film technology in which a photoresist (PR) layer is spun or otherwise coated onto the surface of the preliminary conductive patterns; the PR is exposed to ultraviolet light modulated by a mask bearing the desired patterns; and the unexposed PR is rinsed away using a developer, leaving the areas to be etched exposed. The etch solution which is used for gold conductors is a mixture of potassium-iodine and iodine. After etching, the PR is stripped, and a clean/fire step is performed to burn away any chemical or organic residues remaining after the etching step. This technique is used to define the ultimate dimensions of conductive traces 202 to assure that all of the patterns' dimensions, including thickness and the shape of matching circuit 208, are uniform and within tolerances desired for reliable operation.

After the clean/fire step, a suitable bonding material, such as seal glass or suitable epoxy, is screen printed on the top surface of circuit substrate 106. Note that bonding matieral may be deposited on one or both of seal ring substrate 110 and circuit substrate 106. If the bonding material is to be deposited on the top surface of circuit substrate 106, it will preferably substantially match the dimensions of seal ring substrate 110, which has a larger cavity 124 than the cavity 120 of circuit substrate 106. Thus, the bonding material will not completely cover the top surface of circuit substrate 106. If the bonding material is seal glass, multiple printings may be required to obtain the desired total thickness, with the preferred embodiment including three such printing steps. After each printing step, the seal glass paste is dried and glazed. Because circuit substrate 106 is also to be joined to base 102, a suitable bonding material, as previously described, may be printed onto the bottom surface of circuit substrate 106.

Where the bonding material is seal glass, the glazing temperature is selected to be high enough that volatile materials (organics) within the glass are burned off, but not so high that the conductor on the substrates will melt or flow. The temperature depends on the type of material used, and appropriate temperature ranges are provided by the glass manufacturer. For epoxy, the appropriate cure temperature is provided by the manufacturer. Some slight adjustments in temperature may be necessary due to variations between different types of ovens. Such adjustments are within the level of skill in the art. The selection of the seal glass is dominated by the type of product to be fabricated. In the preferred embodiment, the bonding material is selected to have a coefficient of thermal expansion (CTE) and dielectric constant that match as close as possible the CTE and dielectric constant of the ceramic selected for the substrates. Matching of the CTEs eliminates differential thermal stress between each layer of a multilayer structure.

Separate from the fabrication of circuit substrate 106, ceramic seal ring substrate 110 is fabricated. As with circuit substrate 106, for the pre-fired process, a ceramic material is selected which is fully fired and thus already hardened, the preferred ceramic being 96% pure alumina. The ceramic is the same as that selected for circuit substrate 106. In the preferred embodiment, seal ring substrate 110 is cut to create cavity 124 at its center. This machining is generally performed by laser ablation using a $CO_2$ laser, which is the industry-standard machining technique. Other machining techniques that may be used are ultrasonic machining or wire cutting. Other types of lasers may be used as well.

For an LTCC process, the green tape can be cut using the above techniques, or can be stamped, as is known in the art.

Cavity 124 cut into seal ring substrate 110 is larger than the corresponding cavity 120 that will be cut into circuit substrate 106, as is apparent from the drawings. The resulting ceramic seal ring substrate 110 (pre-fired only) may then be mechanically scrubbed to remove any laser slag that may have built up on the substrate.

After removing the laser slag (if necessary), seal ring substrate 110 is cleaned ultrasonically using a detergent, preferably Alconox, and fired to burn off any residues from the detergent.

As previously mentioned, the circuit substrate 110 and the seal ring substrate 106 may be bonded by deposition of bonding material on one or both of the substrates. The following step is incorporated only if bonding material, e.g., seal glass or suitable epoxy, is to be deposited on the bottom surface of seal ring substrate 110.

A seal glass layer, or other appropriate bonding material, is applied to the bottom surface of seal ring substrate 110. As with circuit substrate 106, application of the seal glass layer requires screen printing, drying and glazing, which steps may be performed a number of times, depending on the materials used, to attain the desired thickness.

Upon fabricating circuit substrate 106 and seal ring substrate 110, the two substrates are subassembled, requiring several steps. First, substrates 106 and 110 are aligned and mated for proper assembly, then the subassembly is fired, during which it may be weighted or clamped together to promote proper lamination and hermeticity between the two substrates. After firing, it may be desirable to check the hermeticity of the seal. The subassembly may be cleaned and inspected, then laser machined to create center cavity 120 in circuit substrate 106, after which it is inspected again. The laser slag is removed by scrubbing.

Second, the subassembly is cleaned ultrasonically using a detergent, preferably a Non Ozone Depleting Solvent (NODS), to remove any grease and is rinsed with deionized water. The subassembly is then fired to burn away any residues left from the detergent.

Third, a conductive paste is applied to the bottom surface of the subassembly (i.e., the bottom surface of circuit substrate 106), and the screen printed conductive paste is then dried and fired, as described above. Again, the preferred conductive paste is a gold paste, and the print-dry-fire step can be performed multiple times to achieve the desired thickness. After applying the conductive paste, the subassembly may be singulated by sawing; that is, each independent subassembly separated from the blank.

After completing the subassembly, final assembly of package 200 is performed. First, an appropriate base 102 is selected. In the preferred embodiment, base 102 is made from Kovar®. A hermeticity check may be performed on the subassembly before final assembly; and the subassembly may be cleaned and fired as necessary. Before attaching base 102 to the subassembly, the bottom surface of circuit substrate 106 may be smoothed in order to prepare the subassembly for soldering. Preparation techniques may vary, depending on the type of solder used. These techniques may effect the amount of solder flow, hermeticity, and visual quality of the assembly. Next, base 102 and the subassembly are fitted together with attaching means therebetween, and the fitted assembly is fired.

As will be apparent to those in the art, bonding material may be eliminated if co-fired technology, e.g., low-temperature co-fired ceramic (LTCC) or high temperature co-fired ceramic (HTCC) is being used, in which case the attaching means will be the glass-ceramic materials incorporated into the pre-fired ceramic substrates. As will also be apparent, due to the flexible nature of the green tape, scrubbing and cleaning steps, if they are to be performed at all, must be deferred until after the green tape is fired.

After firing, a final hermeticity check may be run; the assembly may be cleaned using an acetone or other detergent to remove grease and other residues; and electrical testing may be performed on sample packages.

After completion of the package, the microelectronic circuit 116 to be packaged therein is attached using die attach techniques as known in the art. Lid 114 is then attached to the top surface of seal ring substrate 110 by a non-conductive polymer adhesive, such as epoxy, or a seal glass which can be fired and glazed at a sufficiently low temperature to avoid damaging microelectronic circuit 116. The process for using a non-conductive polymer adhesive comprises screen printing the polymer onto the bottom surface of lid 114, then pre-baking lid 114 to partially cure the adhesive. Alternatively, as previously described, non-conductive adhesive materials are known which can be used to completely fill the cavity, covering the circuit, and providing means for attaching lid 114.

Once microelectronic circuit 116 is mounted inside the package, lid 114 is aligned with seal ring substrate 110 and then clamped in place, after which a final cure is performed at a temperature low enough to avoid damage to microelectronic circuit 116. The signal leads of circuit 116 are attached to conductive wirebond pads 204 by wire or ribbon bonds.

Figure 7:
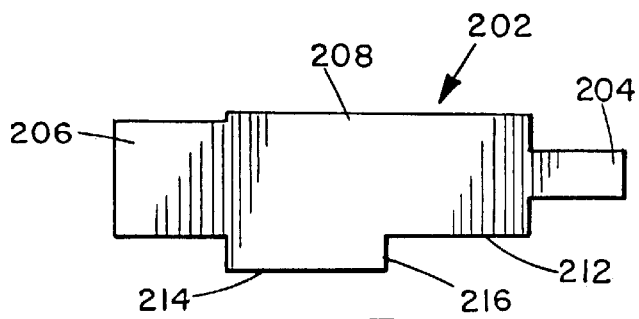
FIG. 7 is a top view of a transmission line including an exemplary shaped matching circuit for use with a high-frequency passband microelectronics package such as that shown in FIG. 4.

Referring to FIG. 7, conductive trace 202 forms a transmission line including wirebond pad 204, lead pad 206, and matching circuit 208 extending therebetween in the area between the external lead frame and wire bond area. Wirebond pad 204 has a width, for example, of 10 mils suitable for tack-welding a bond wire 210 (FIG. 5) to device 116. Lead pad 206 has a width, for example, of 25 mils suitable for electrically attaching a 10 mil wide metal lead 912 (FIGS. 17–20) by braising, soldering, or by using a conductive epoxy or glue. Lead pad 206 is made wider than the width of the lead to allow for some mis-alignment during assembly, and for an attachment fillet to be formed thereon. Lead pad 206 is made long enough (e.g., 25 mils long such that lead pad 206 forms a square) to allow the lead to extend onto lead pad 206 about 25 mils. The lead is trimmed during the attachment process to form the proper length for a strong mechanical bond. These exemplary dimensions for lead pad 206 provide for a solid mechanical bond with a 10 mil wide, 4 mil thick lead extending 25 mils onto pad 206. However, other known dimensions could also be used.

Matching circuit 208, in this exemplary embodiment, includes a first segment 212 attached to bondwire pad 204 and a second segment 214 attached to lead pad 206. Each segment 212 and 214 has a rectilinear shape since each of its sides are straight. Matching circuit 208 has a non-straight shape due to the discontinuity at an edge 216 between segments 212 and 214. Matching circuit 208 is shaped to compensate for impedance discontinuities in the transmission line which connects a node of device 116 to a node on the next level of assembly. Portions of these discontinuities are caused by the lead, and interconnections between the lead and lead pads on the package and the external package, device or circuit board to which the lead is connected. Matching circuit 208 effectively acts to compensate for the inductance of the lead and the lead-attachment materials (e.g., solder or braise) to make the lead act more like a perfect 50 ohm transmission line.

Matching circuit 208 acts as a self-tuned matching circuit or network. The shape of matching circuit 208 is determined by an electromagnetic simulation computer program which simulates the frequency response of the transmission line 202 based upon predetermined parameters defining the electromagnetic environment in which the transmission line will be used. The computer program iterates the shape of matching circuit 208 until the best electrical performance characteristics are achieved at a passband frequency range of interest. The specific computer program used to design this exemplary embodiment of circuit 208 was the Monolithic Microwave Integrated Circuit Computer Aided Design ("MMICAD") computer program commercially available from Optotek Limited of Ontario, Canada. However, other 2-D, 2½-D or 3-D electromagnetic simulation programs could be used.

The shape of matching circuit 208 forms only one embodiment of a matching circuit for use in the present invention. Many other shapes can be determined based on predetermined parameters defining the electromagnetic environment in which the transmission line will be used. These parameters are provided as input parameters for the simulation program, and are described in the following paragraphs. It will be understood that these parameters can be combined in various combinations, and that more or fewer parameters can be used. It will also be understood that, after the simulation program outputs a shape of matching circuit 208 based upon the input parameters, the user can construct prototypes of packages or circuit boards using the shape. The prototype can then be tested to verify that the shape indeed provides the target electrical performance criteria.

A first set of input parameters to the simulation program defines the target electrical performance criteria of the transmission line. These inputs include, for example, the target values for insertion loss and return loss. For example, the target insertion loss may have a value of −0.5 dB maximum, and the target return loss may have a value of −15 dB minimum. These target values provide good electrical performance such that the signals experience minimal changes when transmitted. However, other target values may be used provided they are not too strict such that the simulation program is unable to find a solution for the shape of matching circuit 208, and are not too loose such that the signal changes too much when transmitted. Alternatively, the computer could simply be commanded to output the shape of matching circuit 208 which provides the best performance parameters.

A second set of input parameters defines the passband frequency range for which package 200 will be optimized. This range will depend upon the operating frequencies of device 116 housed within the package, and will depend upon the application for package 200. The passband will range between a minimum and a maximum frequency. In one embodiment, the maximum frequency will be at or above 20 GHz to 23 Ghz. In another embodiment, both the minimum and maximum frequencies will be at or above 20 GHz to 23 GHz. For example, in the exemplary embodiment of FIG. 7, the passband frequency range of interest was specified to be 26–32 GHz. The selection of a passband frequency range of interest is a significant departure from the conventional practice of designing high-frequency microelectronic packages for broadband applications. However, packages dedicated to particular passband frequency ranges make economic sense where, for example, the anticipated volume for the packages is sufficiently high. The simulation program may be unable to find a solution for the shape of matching circuit 208 if the minimum frequency is specified at 0 GHz (i.e., DC) while the maximum frequency is specified in the Gigahertz range. However, it is possible that a broadband solution may also be found using this technique.

A third set of input parameters defines the physical and electrical characteristics of lead pad 206, lead 912 (FIGS. 17–20), and interconnection therebetween. The physical characteristics (e.g., width, length and thickness of lead pad 206 and lead 912; mass of the braise or solder bump) are defined to provide solid mechanical connections between lead pad 206 and the external lead pad, and to provide latitude during assembly. For example, a square lead pad 206 with dimensions of 25 mils and a lead having dimensions of 10 mils wide, 4 mils thick and extending 25 mils onto pad 206, as in FIG. 7, provide for a solid mechanical connection and latitude during assembly. The ability to define the mass of the braise or solder bump can be used to create a matching circuit having a shape which compensates for changes in the mass, thereby further providing latitude during assembly. The ability to compensate for changes in inductance due to changes in the mass may be especially important in high-volume, low-cost consumer electronics applications since the mass can be difficult to control. The electrical characteristics include the conductivity of the materials used for pad 206 (e.g., gold) and the lead (e.g., Kovar® with nickel-gold overplate).

A fourth set of input parameters defines the physical and electrical characteristics of bondwire pad 204, bond wire 210, and the interconnection therebetween. The physical characteristics (e.g., width, length and thickness of bondwire pad 204; diameter of bond wire 210; mass of any bump in the interconnection) are defined to provide solid mechanical connections between bondwire pad 204 and the node of device 116. For example, a bondwire pad 204 having a width of 10 mils and a length of about 25 mils provides a solid mechanical bond when tack-welded to a thin gold bond wire 210. The electrical characteristics include the conductivity of the materials used for pad 204 (e.g., gold) and wire 210 (e.g., also gold).

A fifth set of input parameters defines the physical and electrical characteristics of the transmission line itself. These characteristics include the type of transmission line (e.g., microstrip, regular or suspended CPW, or stripline transmission line), the length of the transmission line (e.g., 110 mils total in FIG. 7), the conductivity of the conductors (e.g., gold) used for the transmission line, and the dielectric constant and thickness of the underlying material (e.g., circuit substrate 106).

A sixth set of input parameters defines constraints on the shape of the matching circuit itself. For example, matching circuit 208 includes two segments 212 and 214 since the shape was limited to two segments. The simulation program was allowed to mix and match the dimensions of the two segments to achieve the target response. However, the matching circuit could include any number of segments (e.g., 1, 2, 3, . . . n). The matching circuit could also be constrained to include only rectilinear segments, or could be allowed to use any shape for each segment, such as non-rectilinear or curvilinear shapes. Other constraints could include maximum dimensions allowed for the shape of the matching circuit such that trace 202 will fit on the available surface area of circuit substrate 106. For example, the width of the matching circuit may be required to be less than some value, especially when multiple traces 202 are spaced relatively closely together.

Other input parameters may also be used to further define the electromagnetic environment that trace 202 will encounter. For example, input parameters may be used to define other sources of electrical impedance discontinuities in the transmission line (e.g., the error in matching width of the bond wire to width of the transmission line conductor, the weld joints of the bond wire, the gap in the dielectric, the gap in the ground plane, or changes in the plane of the signal caused by, for example, formed or Gull Wing leads) such that the shape of the matching circuit compensates for the discontinuity at the passband frequency range of interest.

Once the input parameters have been input, a computer running the electromagnetic simulation program determines the shape of the matching circuit such that the transmission line including trace 202 provides the best performance characteristics at the passband frequency range of interest. The shape is output by the computer, and used for matching circuit 208. If the simulation program is unable to determine a shape for the matching circuit providing a solution for the predetermined input parameters, the user adjusts the parameters and re-executes the program until a solution is found.

Referring to FIG. 8, the predicted electrical insertion loss and return loss of the transmission line including trace 202 of FIG. 7 is plotted. The predictions are the result of the simulation. The x-axis is frequency in GHz, the left y-axis is insertion loss in dB, and the right y-axis is return loss in dB. The predicted insertion loss is shown by curve 218, and the predicted return loss is shown by curve 220. The insertion loss starts near 0 dB at 0 GHz (i.e., DC), increases to a value of about 2.3 dB at 13 GHz, decreases to a value of about 0.2 dB at the frequency range of interest between 26 Ghz and 32 Ghz, and then increases again at higher frequencies. The return loss decreases to a value as low as about 4 dB at frequencies below the frequency range of interest, increases to a value greater than about 28 dB within this range, and then decreases again at higher frequencies. Thus, the transmission line has a predicted insertion loss of about 0.2 dB and a predicted return loss of about 28 dB at the 2–32 GHz frequency range of interest. This is within the target insertion loss of 0.5 dB maximum, and target return loss of 15 dB minimum, that were provided to the computer program. The plot shows that the frequency response is a passband response since the target performance parameters are not met outside the passband. Thus, shaped matching circuit 208 is predicted to compensate for electrical impedance discontinuities of the transmission line, such as that caused by lead 912 (FIGS. 17–20), and the lead interconnections.

Referring to FIGS. 9–11, a microelectronics package 300 in accordance with another embodiment of the present invention is shown. Package 300 includes a base 102, an RF circuit substrate 106 with conductive signal traces 202 formed thereon, and a sealing cap 304. Traces 202 may be the same as traces 202 in package 200, or may have a different shape as determined by the simulation program which accounts for changes in the electromagnetic environment between packages 200 and 300. Package 300 is also used as a leaded electronic interconnect housing for high-frequency electronic devices 116.

Base 102 has multiple uses, including providing a mechanical mount for package 300 onto a circuit board or carrier, a thermal and electrical mount for high-frequency electronic device 116 to be housed in the package, and as a ground reference for high-frequency conductive traces 202 and other signal traces used as the interconnect. As embodied herein, base 102 can be made from either of two different types of materials. First, the base can be made of a conductive metal, such as Kovar®, Invar®, copper, cold rolled steel, copper-tungsten, copper-molybdenum, and molybdenum. Each metal offers advantages in electrical and thermal conductivity, structural strength, low coefficient of thermal expansion, and compatibility to electroplated conductors (for example, nickel, silver, silver-platinum, silver-palladium, or gold). In addition to the metals listed above, base 102 may be made of several low expansion iron-nickel alloys, having a nickel content ranging from 42–52%, with the balance being predominantly iron. One such alloy is identified as Alloy 46, which consists of a combination of 46% nickel with the balance predominantly iron, and is available in commercial quantities from several sources, including National Electronic Alloys of Oakland, N.J. Specifications for the metallurgical properties of Alloy 46 are found in American Society for Test Methods (ASTM) Publication F30. Alloy 46 is a prime material for a low cost package 300, ideal for lower power devices where thermal dissipation is not a significant requirement. The choice of these metals is only exemplary, and other metals can be used.

Base 102 can alternatively be made from a ceramic material, compatible with the remainder of the materials used in package 300. Use of such a ceramic base, however, requires some form of metallization to be applied to certain areas, such as the die attach area for device mounting, for the ground connection, or the bottom surface of base 102 for attaching package 300 to a circuit board or carrier. Examples of such ceramic material are aluminum oxide, aluminum nitride, beryllium oxide, fosterite, cordierite, quartz, fused silica, or other ceramics that would have a composition making them usable as a packaging material. Other ceramic materials not enumerated herein, but providing acceptable electrical and physical properties, can be used and would be known to those skilled in the art.

Attaching or bonding base 102 to circuit substrate 106 utilizes an adhesive, or other bonding material which may differ depending on whether base 102 is metal or ceramic. For a metal base, a metallic solder made from a composition providing good adhesion between metals would be applied either to the top surface of base 102 or the bottom surface of RF circuit substrate 106. An example of such a composition would be copper-silver joining alloy, although other suitable composites will be apparent to those skilled in the art.

For a ceramic base, a variety of attaching materials may be used. Specifically, the ceramic base may be attached with the same options set out above for use with a metal base. Any preparation of the ceramic base for attachment is obvious to those skilled in the art. For example, if the ceramic base is to be attached with metal solder, the base must be metallized so that the solder will adhere. As an alternative to solder, a bonding material, e.g., seal glass, could be applied between base 102 and RF circuit substrate 106 in order to adhere the base to substrate 106.

Another material suitable for either a metal or ceramic base 102 is an organic adhesive. Organic adhesives are an ideal low cost alternative as its use eliminates several process steps and many expensive materials listed above. For example, even if metallization of the ceramic base is required for electrical considerations, use of the organic adhesives eliminate the need to prepare the bottom surface of RF circuit substrate 106 for attachment to base 102. These organic adhesives may include metal filled adhesives such as conductive polymers for higher frequency applications, polyimide, polyvinyl acetate, polyvinyl alcohol, acrylic, phenolic, phenol-resorcinol, epoxy, urea formaldehyde, melamine, alkyd, phenolic-vinyl, phenolic-polyvinyl butyrate, phenolic-nylon, and phenolic neoprene. Those skilled in the art will recognize that the use of a polymer adhesive will permit use of a polymer or a ceramic-filled polymer for base 102. It is to be appreciated, however, that those skilled in the art will recognize that any adhesive providing acceptable electrical and physical properties can also be used.

RF circuit substrate 106 may be made of a ceramic material, such as one of the ceramic materials enumerated above with respect to base 102. Additionally, substrate 106 may also be made from a number of other dielectrics including teflon, glass, low cost electronic grade ceramic, and several plastics, depending on the electrical requirements. More specifically, the glass dielectric materials suitable for substrate 106 include soda lime (float or lamp bulb), alumina silicate, borosilicate (low loss electrical) 99.5% silica for high temperatures. Further, the plastic dielectric materials may be filled or unfilled. The filler could be in the form of a glass matt (for example, G10 printed circuit board material). Also, the ceramics listed above could be used in powdered form as an amorphous filler in the plastic. The plastics could include any of those commonly used in electrical applications, such as epoxy molding compounds and thermoset molding compounds. Specific choices for such plastics include nylon, resins, novalacks, phenolics, polysulfones, polyetherimides, and liquid crystal plastics. Those skilled in the art will recognize that any plastic which provides acceptable electrical and physical properties can also be used.

RF circuit substrate 106 has a cavity area 120 cut out of it such that, when attached to base 102, the substrate and base together provide a planar interconnect for high-frequency electronic device 116 or devices mounted on the base. Moreover, substrate 106 has conductive traces 202 deposited on its surface. Traces 202 are shaped as described above. As described above, the attaching means for bonding the base and circuit substrate can be solder, seal glass or other appropriate bonding material.

The RF circuit substrate 106 and sealing cap 304 are attached utilizing bonding materials such as epoxy deposited on either or both RF circuit substrate 106 and sealing cap 304. If epoxy is to be deposited on substrate 106, it is formed so that the dimensions of the epoxy deposited on the substrate will substantially match those of sealing cap 304. Alternatively, with appropriate non-conductive adhesives, sealing cap 304 can be completely filled with the adhesive which will cover the circuit when sealing cap 304 is attached to RF circuit substrate 106.

Sealing cap 304 may be made of the same or similar material as that used on RF circuit substrate 106. More specifically, sealing cap 304 can be made from a number of dielectric materials including teflon, glass, low cost electronic grade ceramic, and several plastics, depending on the electrical requirements. The glass dielectric materials may include soda lime (float or lamp bulb), alumina silicate, borosilicate (low loss electrical) 99.5% silica for high temperatures. Further, the plastic dielectric materials may be filled or unfilled. The filler could be in the form of a glass matt (e.g., G10 printed circuit board material). Also, the ceramics listed above could be used in powdered form as an amorphous filler in the plastic. The plastics could include any of those commonly used in electrical applications, such as epoxy molding compounds and thermoset molding compounds. Specific choices for such plastics include nylon, resins, novalacks, phenolics, polysulfones, polyetherimides, and liquid crystal plastics. It is to be appreciated, however, that those skilled in the art will recognize that any plastic which provides acceptable electrical and physical properties can also be used.

When a bonding material such as seal glass is used, it is applied to the bottom surface of the sealing cap 304, which, when fused to RF circuit substrate 106 or to glass deposited on substrate 106, creates a hermetic seal between substrate 106 and sealing cap 304. To attain the proper hermeticity and lamination of sealing cap 304 and substrate 106 during the fusing process, e.g., firing the seal glass, the two surfaces can be weighted.

As shown in FIG. 11, sealing cap 304 is formed with a chamber 306 having a larger diameter than cavity 120 formed in RF circuit substrate 106. This allows the placement of sealing cap 304 directly against the upper surface of substrate 106 while still allowing a portion of each conductive trace 202 to be exposed inside chamber 306.

The process for assembling microelectronic package 300 includes the steps of: screen printing conductive traces 202 on RF circuit substrate 106; screen printing first attaching means 104 on the top surface of base 102; and attaching the top surface of base 102 to the bottom surface of substrate 106.

Before beginning the assembly process for package 300, the material for RF circuit substrate 106 is selected. If substrate 106 is made of a ceramic material, it could be the same fully fired ceramic which may be selected for the other components. Any of the ceramic substrates may be alumina ($Al_2O_3$) of various purities (e.g., 96%, 99.6%), berrylia (BeO), barium titanate ($BaTiO_3$), fused silica ($SiO_2$), or aluminum nitride (AlN), the material being selected to meet the specialized requirements of the product to be assembled, which will be within the level of skill in the art. For example, aluminum nitride and berrylia are desirable for high power, heat dissipative applications. In addition to ceramic, RF circuit substrate 106 may be made from a number of dielectrics including teflon, glass, low cost electronic grade ceramic, and several plastics, depending on the electrical requirements. These materials include soda lime (float or lamp bulb), alumina silicate, borosilicate, and filled or unfilled plastics including nylon, resins, novalacks, phenolics, polysulfones, polyetherimides, and liquid crystal plastics.

As in the previous embodiments, as an alternative to the pre-fired ceramic, LTCC technology may be used to form the same basic package structure with appropriate process modifications.

RF circuit substrate 106 is cleaned ultrasonically using a detergent suitable for electronic applications and rinsed with deionized water, then fired to burn out any residues from the detergent. Preferably, an Alconox detergent is used, although other detergents can be used.

Next, conductive patterns or traces 202 are formed on the top surface of RF circuit substrate 106. Such patterns may be formed using a variety of methods. One method of defining the patterns is to screen print preliminary conductive patterns using thick film screen printing techniques. The patterns would have significantly larger dimensions than the desired final dimensions of traces 202. Depending on the application and the type of conductor used, it may be desirable to repeat this printing sequence at least once to attain greater thickness and more uniform density of the printed material, each printing step being followed by drying and firing steps.

When preliminary conductive patterns with dimensions larger than the desired final dimensions are on RF circuit substrate 106, a photolithographic process is used to more precisely define the dimensions of the patterns after which an etch is performed to remove excess conductive material. This patterning step follows the process as is known in thin film technology in which a photoresist (PR) layer is spun or otherwise coated onto the surface of the preliminary conductive patterns; the PR is exposed to ultraviolet light modulated by a mask bearing the desired patterns; and the unexposed PR is rinsed away using a developer, leaving the areas to be etched exposed. The RF circuit substrate is then immersed in an etch solution for etching. This etch solution, typically used for gold conductors, is a mixture of potassium-iodine and iodine. After etching, the PR is stripped, and a clean/fire step is performed to burn away any chemical or organic residues remaining after the etching step. This technique defines the ultimate dimensions of conductive traces 202 to assure that all dimensions, including thickness, are uniform and within the tolerances desired for reliable operation.

Another possible method of defining conductive traces 202 is to screen print the conductive paste using a screen that provides the actual final dimensions of the conductive patterns. This method does not require the use of an etching process. After the conductive paste is printed over the substrate, it is dried. RF circuit substrate 106 is then fired according to the specifications provided by the manufacturer of the paste. Yet another possible method of defining the conductive patterns when ceramic is selected for RF circuit substrate 106 involves the application of metal foil directly on the surface of the ceramic. For example, copper foil may be directly bonded to alumina and other ceramics through a process known as direct bond copper. After bonding the copper foil to the ceramic, the copper foil may be etched using the photolithography/etch sequence as described below to define the final dimensions of the conductive patterns.

Another method of defining the conductive patterns, particularly useful for low-cost packages, involves the implementation of the printed wiring board industry's method of printing a polymer thick film on a substrate. Using this approach, it is possible to incorporate a filled polymer substrate material, instead of alumina ceramic. This allows a large number of RF substrates 106 to be simultaneously formed from a single sheet of polymer. Substrates 106 may then be printed and/or etched with conductive traces 202 for subsequent separation into single substrates. To establish a sufficient conductor thickness, the thick film printed on the polymer substrate may be repeatedly plated using electroplate or electrodeless plate techniques. For example, a high volume approach is to print a silver polymer thick film on a polymer substrate, followed by plated nickel, and plated gold.

Next, a bonding material, e.g. a non-conductive polymer adhesive, such as epoxy, is screen printed on the top surface of RF circuit substrate 106. The epoxy may be deposited on either or both of sealing cap 304 and substrate 106. If epoxy is to be deposited on the top surface of substrate 106, it will substantially match the dimensions of sealing cap 304. Multiple printings of epoxy may be done to obtain the desired total thickness.

Separate from the fabrication of RF circuit substrate 106, sealing cap 304 is fabricated. As discussed above, the sealing cap may be made from a number of dielectric materials including teflon, glass, low cost electronic grade ceramic, and several plastics, depending on the electrical requirements. The glass dielectric materials include soda lime (float or lamp bulb), alumina silicate, borosilicate (low loss electrical) 99.5% silica for high temperatures. Further, the plastic dielectric materials may be filled or unfilled. The filler could be in the form of a glass matt (for example, G10 printed circuit board material). Also, the ceramics listed above could be used in powdered form as an amorphous filler in the plastic. The plastics could include any of those commonly used in electrical applications, such as epoxy molding compounds and thermoset molding compounds. Specific choices for such plastics include Nylon, resins, novalacks, phenolics, polysulfones, polyetherimides, and liquid crystal plastics. It is to be appreciated, however, that any plastic providing acceptable electrical and physical properties can also be used.

After completing RF circuit substrate 106, the final assembly of package 300 is performed. First, an appropriate base 102 is selected from the materials listed above. In this embodiment, base 102 is preferably made of Alloy 52. A hermeticity check may be performed on the subassembly before final assembly; and the subassembly may be cleaned and fired as necessary. Before attaching base 102 to the bottom surface of substrate 106, the bottom surface may be smoothed to facilitate the attachment. Preparation techniques may vary, depending on the type of base material.

Next, base 102 and RF circuit substrate 106 are fitted and bonded together. For this embodiment, the bonding mechanism is an organic adhesive. Such adhesive is, perhaps, a more simple method of attaching substrate 106 to base 102. However, any of the adhesives discussed above will retain substrate 106 and base 102 together.

After fitting base 102 and RF circuit substrate 106 together, the device 116 to be packaged therein is attached to substrate 106 using die attach techniques as are known in the art. Sealing cap 304 is then sealed to the upper surface of substrate 106 by a non-conductive polymer adhesive such as epoxy. The process for using a non-conductive polymer adhesive comprises screen printing the adhesive onto the bottom surface of sealing cap 304, then pre-baking the sealing cap to partially cure the adhesive. Once device 116 is mounted inside package 300, sealing cap 304 is aligned with substrate 106. Sealing cap 304 is then clamped in place on the surface of substrate 106, after which a final cure is performed at a temperature low enough to avoid damage to microelectronic device 116.

The above-described process provides a significant advantage over prior art process sequences in that the number of steps can reduced by more than 30%. In addition, the components used can be formed of less expensive materials, making the package more economical from both a labor and a material perspective.

The transmission lines shown in FIGS. 4–6 have the form of microstrip, embedded microstrip, and microstrip transmission lines as the lines transition from outside package 200, beneath seal ring substrate 110, to inside package 200. The transmission lines shown in FIGS. 9–11 also have the form of microstrip, embedded microstrip, and microstrip transmission lines as the lines transition from outside package 300, beneath sealing cap 304, to inside package 300. However, referring to FIGS. 12–16, shaped matching circuits such as matching circuit 208 can be used with other types of transmission lines, such as CPW transmission lines (regular and suspended) and stripline transmission lines, provided that the correct input parameters (including the type of transmission line) are provided to the simulation program.

Figure 12:
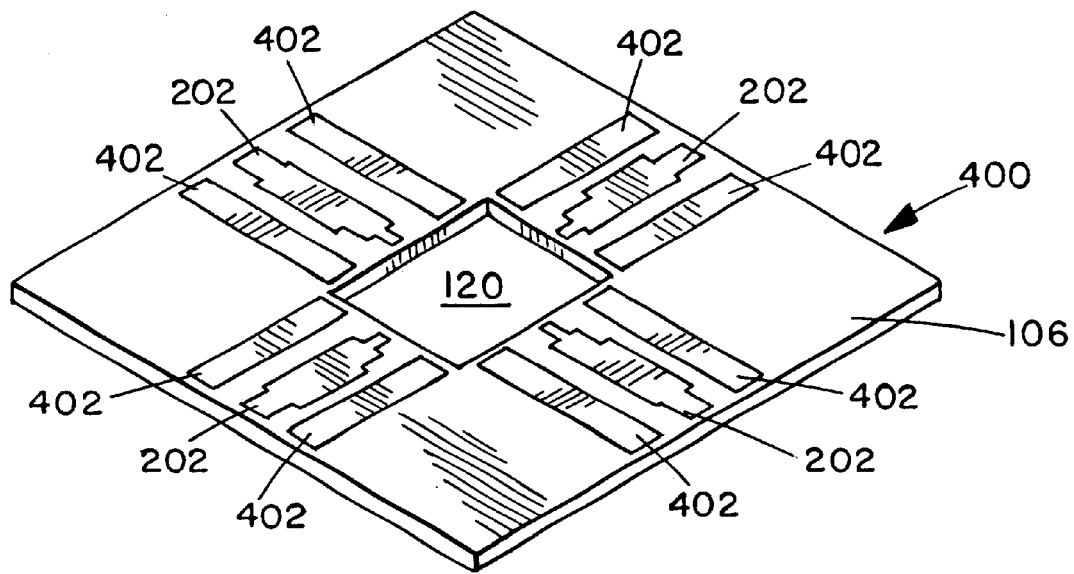
FIG. 12 is a perspective view of a circuit substrate for use in a microelectronics package with co-planar waveguide (CPW) transmission lines including shaped matching circuits for use as a leaded electronic interconnect housing for a high-frequency electronic device, wherein each CPW transmission line includes a signal trace and flanking ground traces.

Referring to FIG. 12, a ceramic circuit substrate 400 for use in a microelectronics package similar to package 200 or 300 in accordance with another embodiment of the present invention is shown. Ceramic circuit substrate 400 is the same as circuit substrate 106, except for the shapes of conductive patterns deposited on the top surface of the substrate using the process described above. These patterns include shaped conductive signal traces 202, each flanked by a pair of conductive ground traces 402. Signal traces 202, although drawn with the same shape as traces 202 in packages 200 and 300, may have a different shape as determined by the simulation program based on the environment. Ground traces 402 provide enhanced electrical noise suppression on signal traces 202. The remaining layers in the package, and process for making them, are as described above.

Each conductive signal trace 202 and flanking ground traces 402 forms a portion of a CPW transmission line. "CPW transmission line" is defined herein as being a conductor flanked by two ground patterns (e.g., traces, rails or planes) and separated from the flanking ground patterns by a dielectric. Such a CPW transmission line forms a regular CPW transmission line when located above a ground plane, and forms a suspended CPW transmission line when not located above a ground plane. Each signal trace 202 is a conductor flanked by a pair of ground traces 402, and traces 202 and 402 are separated by circuit substrate 106. Thus, each signal trace 202 and flanking ground traces 402 forms a portion of a CPW transmission line which propagates a signal between the external device and device 116 as electric and magnetic fields. These transmission lines are regular CPW transmission lines since traces 202 and 402 are located above a ground plane formed by conductive base 102. Alternatively, if base 102 was non-conductive (e.g, made of a non-metallized ceramic), these lines would be suspended CPW transmission lines.

Further, each CPW transmission line including signal trace 202 and flanking ground traces 402 has the form of a CPW, embedded CPW, CPW transmission line as the line transitions from outside package 200 (or 300), beneath seal ring substrate 110 (or sealing cap 304), to inside the package. "Embedded CPW transmission line" is defined herein as being a CPW transmission line embedded beneath a second dielectric. Since ceramic circuit substrate 106 and seal ring substrate 110 (or sealing cap 304) are all dielectrics, the middle portion of each CPW transmission line passing beneath substrate 110 or (cap 304) has the form of an embedded CPW transmission line, and the portions of each CPW transmission line on either side of substrate 110 (or cap 304) have the form of regular CPW transmission lines.

Figure 13:
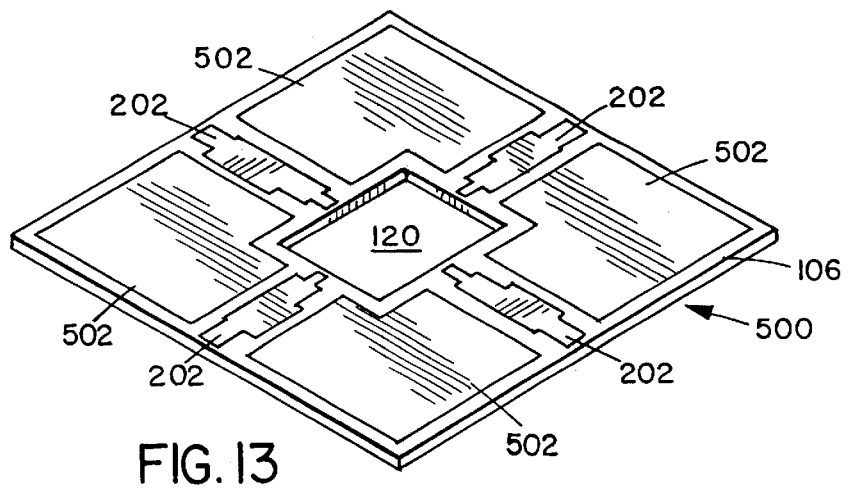
FIG. 13 is a perspective view of a circuit substrate such as that shown in FIG. 12, except that each CPW transmission line includes a signal trace and flanking ground planes.

Referring to FIG. 13, a ceramic circuit substrate 500 for use in a microelectronics package in accordance with another embodiment of the present invention is shown. Ceramic circuit substrate 500 is the same as substrate 106, except for the shapes of conductive patterns deposited on the top surface of the substrate using the same process as described above. These patterns include shaped conductive signal traces 202, each flanked by a pair of conductive ground planes 502. Again, the shape of traces 202 is determined by the simulation program based on the electromagnetic environment. Each ground plane 502 is adjacent to a pair of signal traces 202, and is common to the pair of traces 202. Ground planes 502 can be referred to as continuous ground planes and, as apparent to a person of skill in the art, they can provide enhanced electrical noise suppression on signal traces 502. The remaining layers in the package, and process for making them, are the same as described above. These transmission lines are regular CPW transmission lines since signal traces 202 and ground planes 502 are located above a ground plane formed by conductive base 102. They would be suspended CPW transmission lines if base 102 is made non-conductive. Also, each conductive signal trace 202 and flanking ground planes 502 again forms a portion of a CPW, embedded CPW, CPW transmission line.

Figure 14:
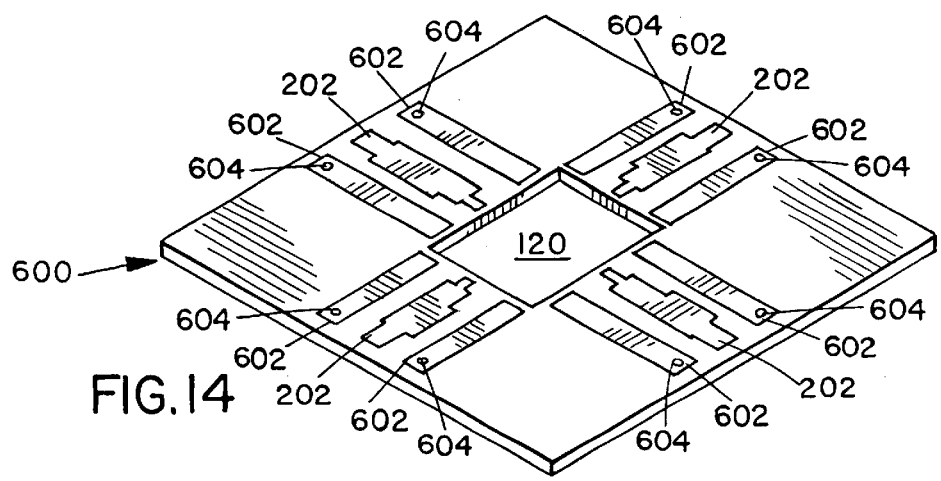
FIG. 14 is a perspective view of a circuit substrate such as that shown in FIG. 12, except that each flanking ground trace is electrically connected to the package base by a conductive via opening.

In the embodiment shown in FIG. 12, the two ground traces 402 adjacent to the signal trace 202 in each transmission line are at the same electrical potential as conductive base 102, and are connected externally to base 102. Some high-frequency circuits may require an RF ground closer than can be achieved by external ground connections. FIGS. 14 and 15 show other embodiments of the present invention which use internal grounding connections for enhanced grounding.

Referring to FIG. 14, a ceramic circuit substrate 600 for use in a microelectronics package in accordance with another embodiment of the present invention is shown. Ceramic circuit substrate 600 is the same as ceramic circuit substrate 400 in FIG. 12, except that each conductive ground trace 602 has a conductive via opening 604 formed therein. (The shape of traces 202 may also be changed depending on the simulation results if the via openings affect the electromagnetic environment.) Via openings 604 are electrically connected to conductive base 102. FIG. 14 shows one via opening 604 formed near the end of each ground pattern 602 near the outer perimeter of substrate 600. However, via openings 604 may also be formed on traces 602 at other locations (e.g., the middle of each trace 602, or near the inner perimeter of substrate 600 adjacent cavity 120). Further, each ground trace 602 could include more than one via opening, and substrate 600 may also include external ground connections as used by the first embodiment. Via openings 604 may also be used to connect ground planes 502 (FIG. 13) to conductive base 102.

Via openings 604 may be formed by machining ceramic circuit substrate 600. This machining is generally performed by laser ablation using, for example, a CO$_2$ laser, which is an industry standard machining technique. Other machining techniques may also be used, such as ultrasonic machining or other types of lasers. Laser slag that may build up around the machined area is removed by mechanically scrubbing or scraping substrate 600. Electrical connections between ground traces 602 and base 102 are provided by filling or coating via openings 604 with a metallic conductor. First, a dielectric paste is screen printed over the top surface of substrate 600, with a pattern corresponding to the locations of the via openings. A high volume vacuum can be applied to the bottom surface of substrate 600 to help the paste flow into via openings 604. The paste is then dried. Any excess paste remaining on the top and bottom surfaces of substrate 600 may be removed by scraping the surfaces, and wiping the surfaces with a lint-free cloth dampened with a solvent. All remaining paste is located within via openings 604 to coat the sidewalls, with the vias remaining open. Substrate 600 is then fired according to the specifications provided by the manufacturer of the dielectric paste. The glass via coating helps to strengthen any microcracks that may have formed around openings 604 during machining and assists in adhesion of a gold conductor.

The glass coated sidewalls are then coated with the gold conductor by screen printing a gold paste using the same screen pattern as was used for the dielectric paste. In a similar manner, the gold paste is pulled into the openings and dried, with excess paste being removed from the surfaces by scraping and wiping the surfaces. The only remaining gold paste is then in the via openings. Again, the vias should remain open following this step. The via openings are then filled with a gold conductor by screen printing a gold paste over the top surface of substrate 600 using a dry/scrape/wipe process to fill the via openings while removing all paste from the surfaces. The printing sequence (print/dry/scrape/wipe) can be repeated to thicken the conductive layer within the via openings, with the gold paste being fired following each printing sequence. The sequence can be repeated until the conductive coating reaches a desired thickness, or until the via opening is filled with conductor. The process of forming conductive via openings is generally known in the art, and other alternatives are available. The remaining layers in the microelectronics package, and the process for making them, are the same as described above in relation to the first embodiment.

Figure 15A:
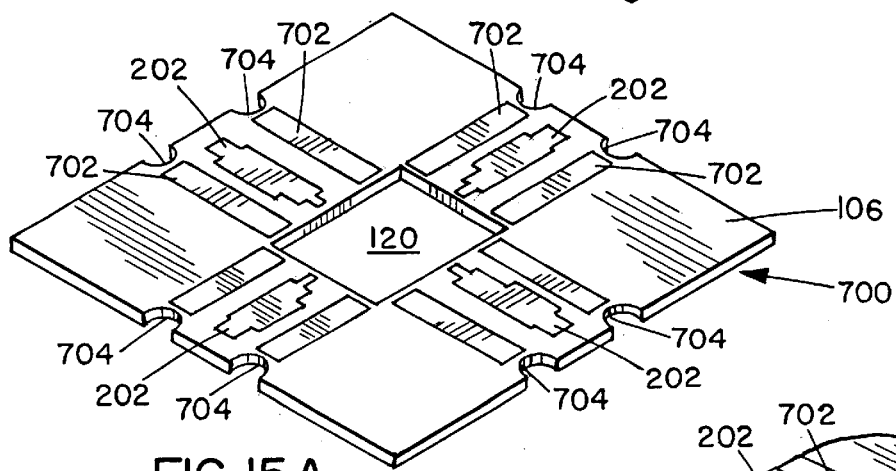
FIG. 15A is a perspective view of a circuit substrate such as that shown in FIG. 12, except that the circuit substrate has "ears" cut into its perimeter to allow wire bonding of the ground traces to the package base.
Figure 15B:
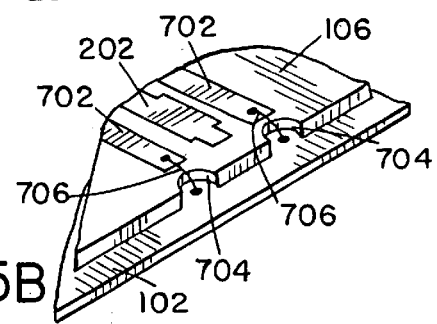
FIG. 15B is a magnified view showing the substrate of FIG. 15A, after assembly to the base, and also showing bonding wires passing through the ears at the substrate's perimeter to bond the ground traces to the base.

Referring to FIGS. 15A–15B, a ceramic circuit substrate 700 for use in a microelectronics package in accordance with another embodiment of the present invention is shown. Substrate 700 is the same as substrate 400, except that an aperture or "ear" 704 has been cut into substrate 700 proximate to each ground trace 702. (The shape of traces 202 may also be changed depending on the simulation results if the ears or bonding wires passing through the ears affect the electromagnetic environment.) FIGS. 15A–15B show ears 704 cut at the outer perimeter of substrate 700. Alternatively, ears 704 could be cut into substrate 700 at its inner perimeter surrounding cavity 120. As shown in the magnified view of FIG. 15B, ears 704 provide apertures for bonding wires 706 or ribbons to pass through. Wires 706 internally connect ground traces 702 to conductive base 102. Bonding wires 706 are attached to traces 702 and base 102 after substrate 700 is attached to base 102 by the above-described process. Ears 704 are also formed by machining ceramic circuit substrate 700 as described above.

Figure 16:
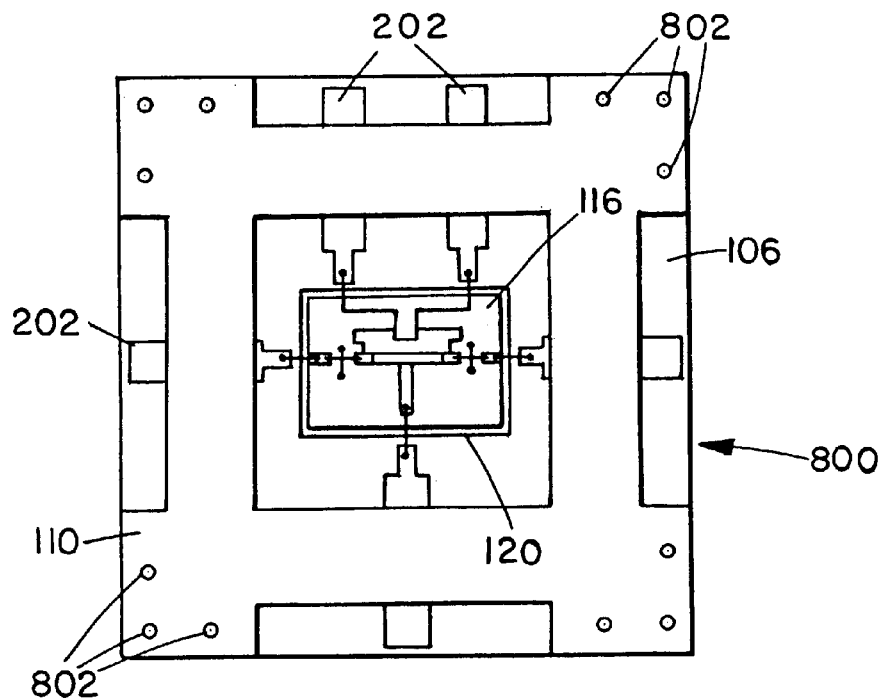
FIG. 16 is a top view of a microelectronics package with stripline transmission lines including shaped matching circuits for use as a leaded electronic interconnect housing for a high-frequency electronic device.

Referring to FIG. 16, a microelectronics package 800 in accordance with another embodiment of the present invention is shown. Package 800 is the same as package 200 shown in FIGS. 4–6, except that the top surface of seal ring substrate 110 has been coated with a conductor (e.g., gold) to form a second ground plane above circuit substrate 106, and conductive via openings 802 have been formed at the corners of substrate 110 to attach the second ground plane to ground at base 102 or circuit substrate 106. (The shape of traces 202 may also be changed depending on the simulation results if the via openings 802 affect the electromagnetic environment.) The via openings 802 were formed using the process as described above.

Each conductive signal trace 202 in package 800 forms a portion of a stripline transmission line. "Stripline transmission line" is defined herein as being a conductor suspended (or "sandwiched") between a lower and an upper ground plane and separated from the ground planes by a dielectric. Each signal trace 202 is a conductor sandwiched between the ground planes formed by base 102 and seal ring substrate 110. Thus, each signal trace 202 forms a portion of a stripline transmission line which propagates a signal between the external device and device 116 as electric and magnetic fields.

Alternatively, instead of using via openings 802, the upper ground plane formed on seal ring substrate 110 can be connected to ground by metallizing the outer side walls of the four square corners of seal ring substrate 110 and connecting the metallized walls to conductive base 102, or to the metallized bottom surface of circuit substrate 106 if this is already electrically connected to base 102. The metallization can be performed by printing or wrapping gold (e.g., thick film gold paste) on the side walls after subassembly of the layers, and then firing the sub-assembly. The lines in this embodiment will also be stripline transmission lines.

Referring to FIGS. 17 and 18, microelectronics package 200 is mounted on a high-frequency circuit board 900. Circuit board 900 includes a lower circuit board layer 902 and a circuit board substrate layer 904 attached to a top surface of layer 902. The dashed lines in FIG. 17 indicate that only the portion of circuit board 900 surrounding package 200 is shown. Circuit board substrate layer 904 includes a cavity or aperture 906 having dimensions slightly larger than the outer dimensions of package 200 such that package 200 can be received within cavity 906 and attached with a suitable adhesive or epoxy to the top surface of lower layer 902. The side walls of package 200 are butted up against the side walls of cavity 906. Lower layer 902 is typically a metal backing (e.g., aluminum), and circuit board substrate layer 904 is typically a ceramic material (similar to that of package 200) or a high-frequency plastic material (e.g., teflon). In an alternate embodiment, the circuit board substrate layer 904 does not require a cavity when package 200 is of a gull wing configuration.

The top surface of circuit board substrate layer 904 has transmission lines 908 formed thereon. Each transmission line 908 includes a conductive lead pad 910 located near a mating lead pad 206 on package 200 such that a lead 912 can be attached between the lead pads by soldering, braising, or a conductive adhesive. Each lead 912 has a width of 10 mils to allow for some mis-alignment during assembly to lead pads 910 and 206, each of which is 25 mil wide. The thickness of circuit board substrate layer 904 is such that each lead 912 extends straight out from lead pad 206 to mating lead pad 910 (i.e., lead pads 206 and 910 are co-planar). Attached to each conductive lead pad 910 is a matching circuit 914 having a shape designed in a manner similar to that of matching circuit 208 to compensate for impedance discontinuities of the transmission line at the high-frequency passband at which package 200 operates. Matching circuits 914 may have the same shape as matching circuit 208, or a different shape determined by the simulation program using appropriate input parameters. Transmission lines 908 transmit signals from package 200 to external pads 916 for attachment to another package or device.

Referring to FIGS. 19 and 20, two microelectronics packages 200 are mounted on circuit board 900 in proximity to each other such that a lead 912 can be attached between mating lead pads 206 on the packages 200. The dimensions of aperture 906 now allow both packages 200 to be received therein with their side walls butted up against the side walls of the aperture. Lead 912 again extends straight out from each lead pad 206 (i.e., lead pads 206 are co-planar). Other leads (not shown) could be used to electrically attach other lead pads 206 of package 200 to lead pads on other microelectronics packages 200, or to lead pads on circuit board 900.

It will be evident that there are additional embodiments and applications which are not disclosed in the detailed description but which clearly fall within the scope and spirit of the present invention. For example, the features described above in relation to each embodiment may be combined with the features of the other embodiments. The specification is, therefore, not intended to be limiting, and the scope of the invention is to be limited only by the following claims.

We claim:

1. A transmission line for use with a high-frequency passband microelectronics package, the package suitable for housing a high-frequency electronic device which operates at frequencies within the passband, the electronic device having at least one electrical node to be electrically coupled by the transmission line and a conductive lead to a corresponding electrical node external to the package, the transmission line comprising:

a first conductive pad for electrical attachment to the electrical node of the high-frequency electronic device housed within the package;

a second conductive pad for electrical attachment by the conductive lead to the electrical node external to the package; and a matching circuit electrically coupled between the first and second conductive pads, the matching circuit including a non-straight conductive trace shaped to compensate for at least one impedance discontinuity between the electrical node of the electronic device and the electrical node external to the package at the high-frequency passband of the package.

2. The transmission line of claim 1, wherein the second conductive pad includes a lead pad for attaching a first end of the conductive lead, the lead having a second end attached to the electrical node external to the package.

3. The transmission line of claim 2, wherein the non-straight conductive trace compensates for the impedance discontinuity caused by the lead.

4. The transmission line of claim 3, wherein the first conductive pad includes a wirebond pad for attaching a first end of a bond wire, the wire having a second end attached to the electrical node of the electronic device.

5. The transmission line of claim 4, wherein the non-straight conductive trace also compensates for the impedance discontinuity caused by the wire.

6. The transmission line of claim 1, wherein the non-straight conductive trace is shaped to compensate for a predetermined high-frequency passband ranging between a minimum and a maximum frequency.

7. The transmission line of claim 6, wherein both the minimum and the maximum frequency of the predetermined passband are above 20 GHz.

8. The transmission line of claim 1, wherein the non-straight conductive trace includes a first segment attached to the first conductive pad, and a second segment attached to the second conductive pad, the first and second segments having a first and a second shape, respectively.

9. The transmission line of claim 8, wherein the first shape is different than the second shape.

10. The transmission line of claim 8, wherein the first and second shapes are each rectilinear.

11. The transmission line of claim 8, wherein at least one of the first and second shapes is not rectilinear.

12. The transmission line of claim 8, wherein the conductive trace has at least one other segment attached between the first and second segments.

13. A high-frequency passband microelectronics package suitable for housing a high-frequency electronic device which operates at frequencies within the passband, the electronic device having at least one electrical node to be electrically coupled by a conductive lead to a corresponding electrical node external to the package, comprising:

a base having a top surface and a bottom surface;

an RF circuit substrate attached to the top surface of the base, the RF circuit substrate having a surface and a cavity for receiving the high-frequency electronic device; and at least one transmission line formed on the surface of the RF circuit substrate, the transmission line including a first conductive pad for electrical attachment to the electrical node of the high-frequency electronic device, a second conductive pad for electrical attachment by the conductive lead to the electrical node external to the package, and a matching circuit electrically coupled between the first and second conductive pads, the matching circuit including a non-straight conductive trace shaped to compensate for at least one impedance discontinuity between the electrical node of the electronic device and the electrical node external to the package at the high-frequency passband of the package.

14. The microelectronics package of claim 13, wherein the second conductive pad includes a lead pad for attaching a first end of the conductive lead, the lead having a second end attached to the electrical node external to the package, and the non-straight conductive trace compensates for the impedance discontinuity caused by the lead.

15. The microelectronics package of claim 14, wherein the at least one transmission line includes a microstrip transmission line.

16. The microelectronics package of claim 15, further comprising a seal ring substrate attached to the RF circuit substrate and having a larger cavity than the cavity of the RF circuit substrate, and a lid attached to the seal ring substrate, wherein a middle portion of the transmission line passes beneath the seal ring substrate, whereby the transmission line forms a microstrip, embedded microstrip, and microstrip transmission line.

17. The microelectronics package of claim 15, further comprising a dielectric sealing cap attached to the RF circuit substrate and having a chamber larger than the cavity of the RF circuit substrate, wherein a middle portion of the transmission line passes beneath the sealing cap, whereby the transmission line forms a microstrip, embedded microstrip, and microstrip transmission line.

18. The microelectronics package of claim 14, wherein the at least one transmission line includes a co-planar waveguide (CPW) transmission line.

19. The microelectronics package of claim 18, wherein the transmission line includes a signal trace including the non-straight conductive trace, and a pair of ground traces flanking the signal trace.

20. The microelectronics package of claim 18, wherein the transmission line includes a signal trace including the non-straight conductive trace, and a pair of ground planes flanking the signal trace.

21. The microelectronics package of claim 18, wherein the base is conductive and the transmission line includes a signal trace including the non-straight conductive trace and a pair of ground patterns flanking the signal trace, the ground patterns electrically coupled to the base by a conductive via opening.

22. The microelectronics package of claim 18, wherein the base is conductive, the transmission line includes a signal trace including the non-straight conductive trace and a pair of ground patterns flanking the signal trace, and the RF circuit substrate has an ear proximate to each ground pattern to allow wire bonding of each ground pattern to the base.

23. The microelectronics package of claim 18, wherein the base is non-conductive and the transmission line is a suspended CPW transmission line.

24. The microelectronics package of claim 14, wherein the base is conductive and the package further includes an upper ground plane disposed above the RF circuit substrate which is electrically coupled to the base, the at least one transmission line including a stripline transmission line.

25. A circuit board for mounting at least one high-frequency microelectronics package which operates at frequencies within a passband, the package having at least one electrical node to be electrically coupled by a conductive lead to a corresponding electrical node external to the package, comprising:

a lower circuit board layer having a top surface and a bottom surface;

a circuit board substrate layer attached to the top surface of the lower circuit board layer, the circuit board substrate layer having a surface for receiving the high-frequency microelectronics package;

at least one transmission line formed on the surface of the circuit board substrate layer, the transmission line including a first conductive pad for electrical attachment by the conductive lead to the electrical node of the high-frequency package, a second conductive pad for electrical attachment to the electrical node external to the package, and a matching circuit electrically coupled between the first and second conductive pads, the matching circuit including a non-straight conductive trace shaped to compensate for at least one impedance discontinuity between the electrical node of the package and the electrical node external to the package at the high-frequency passband of the package.

26. The circuit board of claim 25, wherein the first conductive pad includes a lead pad for attaching a first end of the conductive lead, the lead having a second end attached to the electrical node of the package, and the non-straight conductive trace compensates for the impedance discontinuity caused by the lead.

27. The circuit board of claim 26, wherein the high-frequency package includes a base having a top surface and a bottom surface, an RF circuit substrate attached to the top surface of the base, the RF circuit substrate having a surface and a cavity for receiving a high-frequency electronic device which operates at frequencies within the passband, and at least one package transmission line formed on the surface of the RF circuit substrate, the package transmission line including a third conductive pad for electrical attachment to an electrical node of the high-frequency electronic device, a fourth conductive pad for electrical attachment by the conductive lead to the first conductive pad, and a second matching circuit electrically coupled between the third and fourth conductive pads, the second matching circuit including a non-straight conductive trace shaped to compensate for at least one impedance discontinuity between the electrical node of the electronic device and the electrical node external to the package at the high-frequency passband of the package.

28. The circuit board of claim 25, wherein the surface of the circuit board substrate layer has a cavity for receiving the high-frequency microelectronics package.

29. A process for assembling a high-frequency passband microelectronic package for retaining a high-frequency integrated circuit which operates at frequencies within the passband, the package having a base and an RF circuit substrate, the base and the RF circuit substrate each having top and bottom surfaces, the integrated circuit having at least one electrical node to be electrically coupled by a conductive lead to a corresponding electrical node external to the package, the process comprising the steps of:

depositing at least one transmission line on the top surface of the RF circuit substrate, the transmission line including a first conductive pad for electrical attachment to the electrical node of the integrated circuit retained within the package, a second conductive pad for electrical attachment by the conductive lead to the electrical node external to the package, and a matching circuit electrically coupled between the first and second conductive pads, the matching circuit including a non-straight conductive trace shaped to compensate for at least one impedance discontinuity between the electrical node of the integrated circuit and the electrical node external to the package at the high-frequency passband of the package;

cutting a cavity into the RF circuit substrate, the cavity having dimensions for receiving the high-frequency integrated circuit;

attaching the top surface of the base to the bottom surface of the RF circuit substrate to form an assembly; and firing the assembly.

30. The process of claim 29, wherein the depositing step deposits the transmission line such that the second conductive pad includes a lead pad for attaching a first end of the conductive lead, the lead having a second end attached to the electrical node of the package, and the conductive trace compensates for the impedance discontinuity caused by the lead.

* * * * *